(12) United States Patent
Matsuoka et al.

(10) Patent No.: US 7,955,011 B2
(45) Date of Patent: Jun. 7, 2011

(54) COATING AND DEVELOPING APPARATUS, SUBSTRATE PROCESSING METHOD, AND STORAGE MEDIUM

(75) Inventors: Nobuaki Matsuoka, Koshi (JP); Yasushi Hayashida, Koshi (JP); Shinichi Hayashi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1070 days.

(21) Appl. No.: 11/733,441

(22) Filed: Apr. 10, 2007

(65) Prior Publication Data

US 2008/0014333 A1    Jan. 17, 2008

(30) Foreign Application Priority Data

Apr. 14, 2006   (JP) ................. 2006-112704

(51) Int. Cl.
*G03D 5/04* (2006.01)
(52) U.S. Cl. .................................................. 396/611
(58) Field of Classification Search .............. 396/611
See application file for complete search history.

(56) References Cited

U.S. PATENT DOCUMENTS

| | | | | |
|---|---|---|---|---|
| 6,313,903 | B1 * | 11/2001 | Ogata ......................... | 355/27 |
| 6,593,045 | B2 | 7/2003 | Sato et al. | |
| 6,722,798 | B2 * | 4/2004 | Senba et al. ................ | 396/611 |
| 7,267,497 | B2 * | 9/2007 | Akimoto et al. ............ | 396/611 |
| 7,281,869 | B2 * | 10/2007 | Akimoto et al. ............ | 396/611 |
| 7,488,127 | B2 * | 2/2009 | Ogata et al. ................ | 396/611 |
| 7,530,749 | B2 * | 5/2009 | Yamamoto et al. ......... | 396/611 |
| 7,780,366 | B2 * | 8/2010 | Ogata et al. ................ | 396/578 |
| 2002/0168191 | A1 * | 11/2002 | Fukuda et al. .............. | 396/611 |
| 2006/0201615 | A1 * | 9/2006 | Matsuoka et al. .......... | 156/272.2 |
| 2006/0213052 | A1 * | 9/2006 | Matsuoka et al. .......... | 29/593 |

FOREIGN PATENT DOCUMENTS

| | | |
|---|---|---|
| JP | 2001-176792 | 6/2001 |
| JP | 2002-33266 | 1/2002 |
| JP | 2002-329661 | 11/2002 |
| JP | 2003-158056 | 5/2003 |
| JP | 2004-311714 | 11/2004 |
| JP | 2006-269672 | 10/2006 |

OTHER PUBLICATIONS

Japanese Office Action issued Oct. 20, 2010, in Patent Application No. 2006-112704 (with English-language translation).

* cited by examiner

*Primary Examiner* — Clayton E Laballe
*Assistant Examiner* — Bret Adams
(74) *Attorney, Agent, or Firm* — Oblon, Spivak, McClelland, Maier & Neustadt, L.L.P.

(57) ABSTRACT

A coating and developing apparatus is provided which requires a smaller occupation space even when it incorporates a substrate inspection unit, while eliminating a disadvantageous layout. A coating film forming part B3 including a plurality of process units and transfer mechanisms A3 and A4, and a developing part B1 including a plurality of process units 31 and a transfer mechanism A1 are vertically arranged in a process block S2. There are disposed in the process block S2 on a side of a carrier block S1, a plurality of vertically arranged transfer units TRS for transferring a substrate W between the same and transfer mechanisms for the respective parts, and a vertically movable transfer mechanism D1 for the transfer unit for transferring a substrate between these transfer units. At least one of the coating film forming part and the developing part includes a substrate inspection unit 43 for inspecting a substrate transferred by the transfer mechanism for the corresponding part.

9 Claims, 14 Drawing Sheets

COATING AND DEVELOPING APPARATUS, SUBSTRATE PROCESSING METHOD, AND STORAGE MEDIUM

CROSS REFERENCE TO RELATED APPLICATIONS

This application is based upon and claims the benefit of priority from the prior Japanese Patent Application No. 2006-112704 filed on Apr. 14, 2006, the entire contents of which are incorporated herein by reference.

BACKGROUND OF THE INVENTION

1. Field of the Invention

The present invention relates to a coating and developing apparatus for coating a substrate such as a semiconductor wafer or an LCD substrate (glass substrate for a liquid crystal display panel) with a resist liquid and developing the substrate after exposure thereof, a substrate processing method, and a storage medium storing a program for executing the substrate processing method.

2. Description of Related Art

One of the processes for manufacturing a semiconductor device and an LCD substrate includes a series of steps in which a resist film is formed on a substrate, then the resist film is exposed with the use of a photomask, and thereafter the resist film is developed so as to obtain a desired pattern. This process is generally performed by a system including a coating and developing apparatus for coating a substrate with a resist liquid and developing the substrate, and an exposure apparatus connected to the coating and developing apparatus. Substrates on which a certain resist pattern has been formed are subjected to a predetermined inspection in which a line width of the resist pattern, an overlapping condition of the resist pattern and a base pattern, a development defect, and so on are checked for each substrate. Then, only the accepted substrates are transferred to the succeeding step. This inspection of the substrates is often conducted by a so-called standalone type inspecting apparatus which is separated from a coating and developing apparatus. However, it is more convenient to employ a so-called inline system in which the coating and developing apparatus includes a substrate inspecting apparatus.

JP2002-33266A (section 0095) describes a coating and developing apparatus employing such an inline system. As shown in FIG. 14, in the apparatus disclosed in this document, a process block (process area) P2 and an interface block (interface area) P3 are connected to a carrier block (carrier area) P1 at a rear side thereof. Further, an exposure apparatus P4 is connected to the interface block P3. The carrier block P1 has a carrier stage 11 on which a carrier 10 containing a plurality of substrates is placed, and a transfer arm (transfer mechanism for the carrier block) 12 for sending a substrate to the carrier 10 placed on the carrier stage 11 and receiving a substrate therefrom. A substrate contained in the carrier 10 is loaded into the process block P2 via the transfer arm 12, and then a resist film is formed on the substrate in the process block P2. Thereafter, the substrate having the resist film formed thereon is loaded through the interface block P3 into the exposure apparatus P4 where the substrate is subjected to an exposure process. The exposed substrate is loaded through the interface block P3 into the process block P2 where the substrate is subjected to a developing process. The developed substrate is received by the transfer arm 12 which then transfers the same into the carrier block P1.

A substrate inspection unit 13 is disposed on a lateral side of the carrier block P1. The developed substrate is loaded into the substrate inspection unit 13 by the transfer arm 12 via an intermediate stage 15 and a special arm 14, and is subjected to the above-described inspection. The inspected substrate is reversely delivered to the transfer arm 12 through the reversed path, and is returned to the original carrier 10.

When the substrate inspection unit 13 is connected to a block other than the carrier block P1, e.g., when the substrate inspection unit 13 is connected to the interface block P3, the developed substrate has to be returned again to the interface block P3. This structure complicates the transfer channel of the substrate, which results in a degraded substrate transferring efficiency. Further, since the interface block P3 accommodates a buffer cassette for absorbing a difference in processing speeds of the interface block P3 and the exposure apparatus, and a temperature adjusting unit for precisely setting a temperature of the substrate at a temperature of the exposure apparatus, there is not an enough space for the substrate inspection unit in the process block. Thus, in order to accommodate the substrate inspection unit, the interface block P3 has to be enlarged. Alternatively, disposition of the substrate inspection unit 13 in the process block P2 is disadvantageous in terms of space and transfer channel.

For these reasons, the substrate inspection unit 13 is connected to the carrier block P1. This structure is highly advantageous in that, even when the coating and developing processes are stopped for, e.g., a maintenance of the process block P2, a substrate can be loaded into the substrate inspection unit 13 from outside through the carrier block P1, i.e., the substrate inspection unit 13 can be independently used.

However, the substrate inspection unit 13 connected to the lateral side of the carrier block P1 laterally protrudes therefrom. Thus, when the coating and developing apparatus together with the substrate inspection unit is installed in a clean room, such an installation is inefficient in the utilization of space, whereby there arises a problem regarding arrangement of a peripheral equipment and securement of a maintenance space. In particular, when a larger substrate, e.g. a substrate such as a semiconductor wafer (referred to as "wafer" below) having a diameter not less than 12 inches is processed, the substrate inspection unit 13 is necessarily enlarged, which makes the problem more serious.

JP2006-269672A discloses an example in which an inspecting block having the substrate inspection unit is interposed between the carrier block and the process block. However, this layout requires a larger space for installation including a layout of the process block. In addition, since a substrate transfer mechanism disposed on the inspecting block takes charge both of a transferring operation of a substrate between the carrier block and the process block and a transferring operation of a substrate to the inspection unit, the transfer mechanism bears an increased burden.

SUMMARY OF THE INVENTION

The present invention has been made in view of the foregoing circumstances. The object of the present invention is to provide a coating and developing apparatus which requires a smaller occupation space even when it incorporates a substrate inspection unit, while eliminating a disadvantageous layout. Another object of the present invention is to provide a substrate processing method and a storage medium storing a program for executing the substrate processing method, which are capable of enhancing a throughput when the coating and developing apparatus is operated to inspect a processed substrate.

A first coating and developing apparatus of the present invention is a coating and developing apparatus comprising: a process block including coating film forming parts each for forming a coating film on a substrate, and a developing part for developing a substrate; a carrier block including a transfer mechanism for the carrier block that delivers to the process block a substrate on which a coating film is to be formed, and receives the developed substrate from the process block; and an interface block that receives from the process block the substrate on which the coating film has been formed and delivers the substrate to an exposure apparatus, and receives an exposed substrate from the exposure apparatus and delivers the substrate to the process block; wherein the coating film forming parts and the developing part are vertically arranged in the process block, each of the coating film forming parts includes: one or more liquid process unit(s) for applying a coating liquid to a substrate; a heating process unit for heating a substrate to which the coating liquid has been applied; and a transfer mechanism for the coating film forming part for transferring a substrate between these process units of the liquid process unit(s) and the heating process unit, at least one of the coating film forming parts including a liquid process unit for applying a resist liquid to a substrate, the developing part includes a heating process unit for heating an exposed substrate, a liquid process unit for applying a developing liquid to a substrate, and a transfer mechanism for the developing part for transferring a substrate between these process units of the liquid process unit and the heating process unit, the process block further includes: a plurality of transfer units arranged at height positions respectively corresponding to the coating film forming parts and the developing part, a substrate being transferred between each transfer unit and the corresponding part via the transfer mechanism for the corresponding part; and a vertically movable transfer mechanism for the transfer unit for transferring a substrate between these transfer units, and at least one of the coating film forming parts and the developing part further includes a substrate inspection unit for inspecting a substrate that has been transferred thereto by the transfer mechanism for the corresponding part. In the first coating and developing apparatus, the vertical arrangement order of the coating film forming parts and the developing part in the process block is not specifically limited.

In the first coating and developing apparatus of the present invention, the coating film forming part including the liquid process unit for applying a resist liquid to a substrate may include the substrate inspection unit for inspecting a substrate on which a resist film has been formed, and the developing part may include the substrate inspection unit for inspecting a developed substrate.

In addition, in the first coating and developing apparatus of the present invention, at least one of the transfer mechanisms for the coating film forming part and the transfer mechanism for the developing part may move along a path extending in the corresponding part between a side of the carrier block and a side of the interface block, the process units may be disposed on opposite sides of the path along which the transfer mechanism moves, and the substrate inspection unit may be disposed at least on one of the sides of the path.

Further, in the first coating and developing apparatus of the present invention, the process block may further include a direct transfer part vertically stacked on the coating film forming parts and the developing part, and the direct transfer part ma include a transfer mechanism for the direct transfer part for directly transferring a substrate on which a coating film has been formed in the process block from a side of the carrier block to a side of the interface block. In the first coating and developing apparatus, the vertical arrangement order of the coating film forming parts, the developing part, and the direct transfer part in the process block is not specifically limited.

Further, in the first coating and developing apparatus of the present invention, the transfer units may be disposed on sides of the coating film forming parts and the developing part such that the carrier block is closer to the transfer units than to the coating film forming parts and the developing part, and the transfer mechanism for the carrier block may transfer a substrate between the same and at least one of the transfer units.

Further, in the first coating and developing apparatus of the present invention, the process block may include at least one second transfer unit different from said transfer units, the second transfer unit being arranged at a height position corresponding to one of the coating film forming parts and the developing part. In the coating and developing apparatus, a transfer of a substrate between the process block and the carrier block may be performed via the transfer units, and a transfer of a substrate between the process block and the interface block may be performed via the second transfer unit.

A second coating and developing apparatus of the present invention is a coating and developing apparatus comprising: a process block including coating film forming parts each for forming a coating film on a substrate, a developing part for developing a substrate, and a substrate inspection part for inspecting a substrate; a carrier block including a transfer mechanism for the carrier block that delivers to the process block a substrate on which a coating film is to be formed, and receives the developed substrate from the process block; and an interface block that receives from the process block the substrate on which the coating film has been formed and delivers the substrate to an exposure apparatus, and receives an exposed substrate from the exposure apparatus and delivers the substrate to the process block; wherein the coating film forming parts, the developing part, and the substrate inspection part are vertically arranged in the process block, each of the coating film forming parts includes: one or more liquid process unit(s) for applying a coating liquid to a substrate; a heating process unit for heating a substrate to which the coating liquid has been applied; and a transfer mechanism for the coating film forming part for transferring a substrate between these process units of the liquid process unit(s) and the heating process unit, at least one of the coating film forming parts including a liquid process unit for applying a resist liquid to a substrate, the developing part includes a process unit having a heating process unit for heating an exposed substrate, a liquid process unit for applying a developing liquid to a substrate, and a transfer mechanism for the developing part for transferring a substrate between these process units of the liquid process unit and the heating process unit, the substrate inspection part includes a plurality of substrate inspection units for inspecting a substrate, and a transfer mechanism for the substrate inspection part for transferring a substrate between these substrate inspection units, and the process block further includes: a plurality of transfer units arranged at height positions respectively corresponding to the coating film forming parts, the developing part, and the substrate inspection part, a substrate being transferred between each transfer unit and the corresponding part via the transfer mechanism for the corresponding part; and a vertically movable transfer mechanism for the transfer unit for transferring a substrate between these transfer units. In the second coating and developing apparatus, the vertical arrangement order of the coating film forming parts, the developing part, and the substrate inspection part in the process block is not specifically limited.

In the second coating and developing apparatus of the present invention, the process block may further include a direct transfer part vertically stacked on the coating film forming parts, the developing part, and the substrate inspection part, and the direct transfer part may include a transfer mechanism for the direct transfer part for directly transferring a substrate on which a coating film has been formed in the process block from a side of the carrier block to a side of the interface block. In the second coating and developing apparatus, the vertical arrangement order of the coating film forming parts, the developing part, the substrate inspection part, and the direct transfer part in the process block is not specifically limited.

In addition, in the second coating and developing apparatus of the present invention, the substrate inspection part may include a substrate inspection unit for inspecting a substrate on which a resist film has been formed, and a substrate inspection unit for inspecting a developed substrate, the transfer units may be disposed on sides of the coating film forming parts, the developing part, and the substrate inspection part such that the carrier block is closer to the transfer units than to the coating film forming parts, the developing part, and the substrate inspection part, and a second transfer unit may be disposed on sides of the substrate inspection part such that the interface block is closer to the second transfer unit than the substrate inspection part, a substrate being transferred between the second transfer unit and the substrate inspection part, and a substrate being transferred between the second transfer unit and the interface block.

Further, in the second coating and developing apparatus of the present invention, the transfer units may be disposed on sides of the coating film forming parts, the developing part, and the substrate inspection part such that the carrier block is closer to the coating film forming parts, the developing part, and the substrate inspection part, and the transfer mechanism for the carrier block may transfer a substrate between the same and at least one of the transfer units.

A first substrate processing method of the present invention is a substrate processing method for processing a substrate with the use of a coating and developing apparatus comprising: a process block including a coating film forming part for forming a coating film on a substrate, and a developing part for developing a substrate; a carrier block from which a substrate is transferred to the process block and to which a substrate is transferred from the process block; and an interface block to which a substrate is transferred from the process block and from which a substrate is transferred to the process block, the interface block being connected to an exposure apparatus; wherein the process block further includes a direct transfer part having a transfer mechanism for the direct transfer part for directly transferring a substrate in the process block between a side of the carrier block and a side of the interface block, the coating film forming part, the developing part, and the direct transfer part are vertically arranged in the process block, each of the coating film forming part and the developing part includes a process unit for processing a substrate, a substrate inspection unit for inspecting a substrate, and a transfer mechanism for the corresponding part for transferring a substrate between these units, and the process block further includes: a plurality of transfer units respectively corresponding to the coating film forming part, the developing part, and the direct transfer part, a substrate being transferred between each transfer unit and the transfer mechanisms for the corresponding parts; and a transfer mechanism for the transfer unit for transferring a substrate between these transfer units, the substrate processing method comprising the steps of: transferring a substrate loaded into the carrier block to the coating film forming part of the process block; forming a resist film on the substrate in the process unit of the coating film forming part; transferring the substrate on which the resist film has been formed by the transfer mechanism for the coating film forming part to the substrate inspection unit of the coating film forming part, and inspecting the substrate; transferring the inspected substrate form the coating film forming part to the direct transfer part via the transfer unit, and further transferring the substrate to the interface block by means of the transfer mechanism for the direct transfer part; transferring the exposed substrate to the developing part of the process block; developing the exposed substrate in the process unit of the developing part; transferring the developed substrate by the transfer mechanism for the developing part to the substrate inspection unit of the developing part, and inspecting the substrate; and transferring the inspected substrate to the carrier block. The vertical arrangement order of the coating film forming parts, the developing part, and the direct transfer part in the process block is not specifically limited.

A second substrate processing method of the present invention is a substrate processing method for processing a substrate with the use of a coating and developing apparatus comprising: a process block including a coating film forming part for forming a coating film on a substrate, a developing part for developing a substrate, and a substrate inspection part for inspecting a substrate; a carrier block from which a substrate is transferred to the process block and to which a substrate is transferred from the process block; and an interface block to which a substrate is transferred from the process block and from which a substrate is transferred to the process block, the interface block being connected to an exposure apparatus; wherein the coating film forming part, the developing part, and the substrate inspection part are vertically arranged in the process block, each of the coating film forming part, the developing part, and the substrate inspection part includes a transfer mechanism for the corresponding part for transferring a substrate in the corresponding part, and the process block further includes: a plurality of transfer units respectively corresponding to the coating film forming part, the developing part, and the substrate inspection part, a substrate being transferred between each transfer unit and the corresponding part; and a transfer mechanism for the transfer unit for transferring a substrate between these transfer units, the substrate processing method comprising the steps of: transferring a substrate loaded into the carrier block to the coating film forming part of the process block, and forming a resist film on the substrate; transferring the substrate on which the resist film has been formed from the coating film forming part to the substrate inspection part via the transfer unit, and inspecting the substrate; transferring the inspected substrate by means of the transfer mechanism for the substrate inspection part to a second transfer unit different from said transfer units, the second transfer unit being disposed on a side of the process unit such that the interface block is closer to the second transfer unit than to the process unit, and further transferring the substrate to the interface block via the second transfer unit; transferring the exposed substrate to the developing part of the process block, and developing the substrate; transferring the developed substrate from the developing part to the substrate inspection part via the transfer unit, and inspecting the substrate; and transferring the inspected substrate to the carrier block. The vertical arrangement order of the coating film forming parts, the developing part, and the substrate inspection part is not specifically limited.

A third substrate processing method of the present invention is a substrate processing method for processing a substrate with the use of a coating and developing apparatus comprising: a process block including a coating film forming part for forming a coating film on a substrate, a developing part for developing a substrate, and a substrate inspection part for inspecting a substrate; a carrier block from which a substrate is transferred to the process block and to which a substrate is transferred from the process block; and an interface block to which a substrate is transferred from the process block and from which a substrate is transferred to the process block, the interface block being connected to an exposure apparatus; wherein the process block further includes a direct transfer part having a transfer mechanism for the direct transfer part for directly transferring a substrate in the process block between a side of the carrier block and a side of the interface block, the coating film forming part, the developing part, the substrate inspection part, and the direct transfer part are vertically arranged in the process block, each of the coating film forming part, the developing part, and the substrate inspection part includes a transfer mechanism for the corresponding part for transferring a substrate in the corresponding part, and the process block further includes: a plurality of transfer units respectively corresponding to the coating film forming part, the developing part, the substrate inspection part, and the direct transfer part, a substrate being transferred between each transfer unit and the corresponding part; and a transfer mechanism for the transfer unit for transferring a substrate between these transfer units, the substrate processing method comprising the steps of: transferring a substrate loaded into the carrier block to the coating film forming part of the process block, and forming a resist film on the substrate; transferring the substrate on which the resist film has been formed from the coating film forming part to the substrate inspection part via the transfer unit, and inspecting the substrate; transferring the inspected substrate from the substrate inspection part to the direct transfer part via the transfer unit, and further transferring the substrate to the interface block by means of the transfer mechanism for the direct transfer part; transferring the exposed substrate to the developing part of the process block, and developing the substrate; transferring the developed substrate from the developing part to the substrate inspection part via the transfer unit, and inspecting the substrate; and transferring the inspected substrate to the carrier block. The vertical arrangement order of the coating film forming parts, the developing part, the substrate inspection part, and the direct transfer part in the process block is not specifically limited.

A first storage medium of the present invention is a storage medium storing a program executed by a control device for controlling a coating and developing apparatus comprising: a process block including a coating film forming part for forming a coating film on a substrate, and a developing part for developing a substrate; a carrier block from which a substrate is transferred to the process block and to which a substrate is transferred from the process block; and an interface block to which a substrate is transferred from the process block and from which a substrate is transferred to the process block, the interface block being connected to an exposure apparatus; wherein the process block further includes a direct transfer part having a transfer mechanism for the direct transfer part for directly transferring a substrate in the process block between a side of the carrier block and a side of the interface block, the coating film forming part, the developing part, and the direct transfer part are vertically arranged in the process block, each of the coating film forming part and the developing part includes a process unit for processing a substrate, a substrate inspection unit for inspecting a substrate, and a transfer mechanism for the corresponding part for transferring a substrate between these units, the process block further includes: a plurality of transfer units respectively corresponding to the coating film forming part, the developing part, and the direct transfer part, a substrate being transferred between each transfer unit and the corresponding part; and a transfer mechanism for the transfer unit for transferring a substrate between these transfer units, the storage medium executed by the control device to execute a substrate processing method comprising the steps of: transferring a substrate loaded into the carrier block to the coating film forming part of the process block; forming a resist film on the substrate in the process unit of the coating film forming part; transferring the substrate on which the resist film has been formed by the transfer mechanism for the coating film forming part to the substrate inspection unit of the coating film forming part, and inspecting the substrate; transferring the inspected substrate from the coating film forming part to the direct transfer part via the transfer unit, and further transferring the substrate to the interface block by means of the transfer mechanism for the direct transfer part; transferring the exposed substrate to the developing part of the process block; developing the exposed substrate in the process unit of the developing part; transferring the developed substrate by the transfer mechanism for the developing part to the substrate inspection unit of the developing part, and inspecting the substrate; and transferring the inspected substrate to the carrier block. The vertical arrangement order of the coating film forming parts, the developing part, and the direct transfer part in the process block is not specifically limited.

A second storage medium of the present invention is a storage medium storing a program executed by a control device for controlling a coating and developing apparatus comprising: a process block including a coating film forming part for forming a coating film on a substrate, a developing part for developing a substrate, and a substrate inspection part for inspecting a substrate; a carrier block from which a substrate is transferred to the process block and to which a substrate is transferred from the process block; and an interface block to which a substrate is transferred from the process block and from which a substrate is transferred to the process block, the interface block being connected to an exposure apparatus; wherein the coating film forming part, the developing part, and the substrate inspection part are vertically arranged in the process block, each of the coating film forming part, the developing part, and the substrate inspection part includes a transfer mechanism for the corresponding part for transferring a substrate in the corresponding part, and the process block further includes: a plurality of transfer units respectively corresponding to the coating film forming part, the developing part, and the substrate inspection part, a substrate being transferred between each transfer unit and the corresponding part; and a transfer mechanism for the transfer unit for transferring a substrate between these transfer units, the storage medium executed by the control device to execute a substrate processing method comprising the steps of: transferring a substrate loaded into the carrier block to the coating film forming part of the process block, and forming a resist film on the substrate; transferring the substrate on which the resist film has been formed from the coating film forming part to the substrate inspection part via the transfer unit, and inspecting the substrate; transferring the inspected substrate by means of the transfer mechanism for the substrate inspection part to a second transfer unit different from said transfer unit, the second transfer unit being disposed on a side of the process unit such that the interface block is closer to the second transfer unit than to the process unit, and further transferring the substrate to the interface block via the second transfer unit; transferring the exposed substrate to the developing part of the process block, and developing the substrate; transferring the developed substrate from the developing part to the substrate inspection part via the transfer unit, and inspecting the substrate; and transferring the inspected substrate to the carrier block. The vertical arrangement order of the coating film forming parts, the developing parts, and the substrate inspection part in the process block is not specifically limited.

A third storage medium of the present invention is a storage medium storing a program executed by a control device for controlling a coating and developing apparatus comprising: a process block including a coating film forming part for forming a coating film on a substrate, a developing part for developing a substrate, and a substrate inspection part for inspecting a substrate; a carrier block from which a substrate is transferred to the process block and to which a substrate is transferred from the process block, and an interface block to which a substrate is transferred from the process block and from which a substrate is transferred to the process block, the interface block being connected to an exposure apparatus; wherein the process block further includes a direct transfer part having a transfer mechanism for the direct transfer part for directly transferring a substrate in the process block between a side of the carrier block and a side of the interface block, the coating film forming part, the developing part, the substrate inspection part, and the direct transfer part are vertically arranged in the process block, each of the coating film forming part, the developing part, and the substrate inspection part includes a transfer mechanism for the corresponding part for transferring a substrate in the corresponding part, and the process block further includes: a plurality of transfer units respectively corresponding to the coating film forming part, the developing part, the substrate inspection part, and the direct transfer part, a substrate being transferred between each transfer unit and the corresponding part; and a transfer mechanism for the transfer unit for transferring a substrate between these transfer units, the storage medium executed by the control device to execute a substrate processing method comprising the steps of: transferring a substrate loaded into the carrier block to the coating film forming part of the process block, and forming a resist film on the substrate; transferring the substrate on which the resist film has been formed from the coating film forming part to the substrate inspection part via the transfer unit, and inspecting the substrate; transferring the inspected substrate from the substrate inspection part to the direct transfer part via the transfer unit, and further transferring the substrate to the interface block by means of the transfer mechanism for the direct transfer part; transferring the exposed substrate to the developing part of the process block, and developing the substrate; transferring the developed substrate from the developing part to the substrate inspection part via the transfer unit, and inspecting the substrate; and transferring the inspected substrate to the carrier block. The vertical arrangement order of the coating film forming parts, the developing part, the substrate inspection part, and the direct transfer part in the process block is not specifically limited.

According to the present invention, the substrate inspection unit is incorporated in one of the coating film forming part and the developing part that are vertically arranged. According to another invention, the substrate inspection part including the substrate inspection unit is vertically arranged on the coating film forming part and the developing part. In either of the inventions, the outward protrusion of the substrate inspection unit from the body of the coating and developing apparatus can be avoided. As a result, the coating and developing apparatus can have a favorable contour, and a space occupied by the coating and developing apparatus can be reduced.

DETAILED DESCRIPTION OF THE INVENTION

Embodiments of the present invention will be described herebelow.

Figure 1:
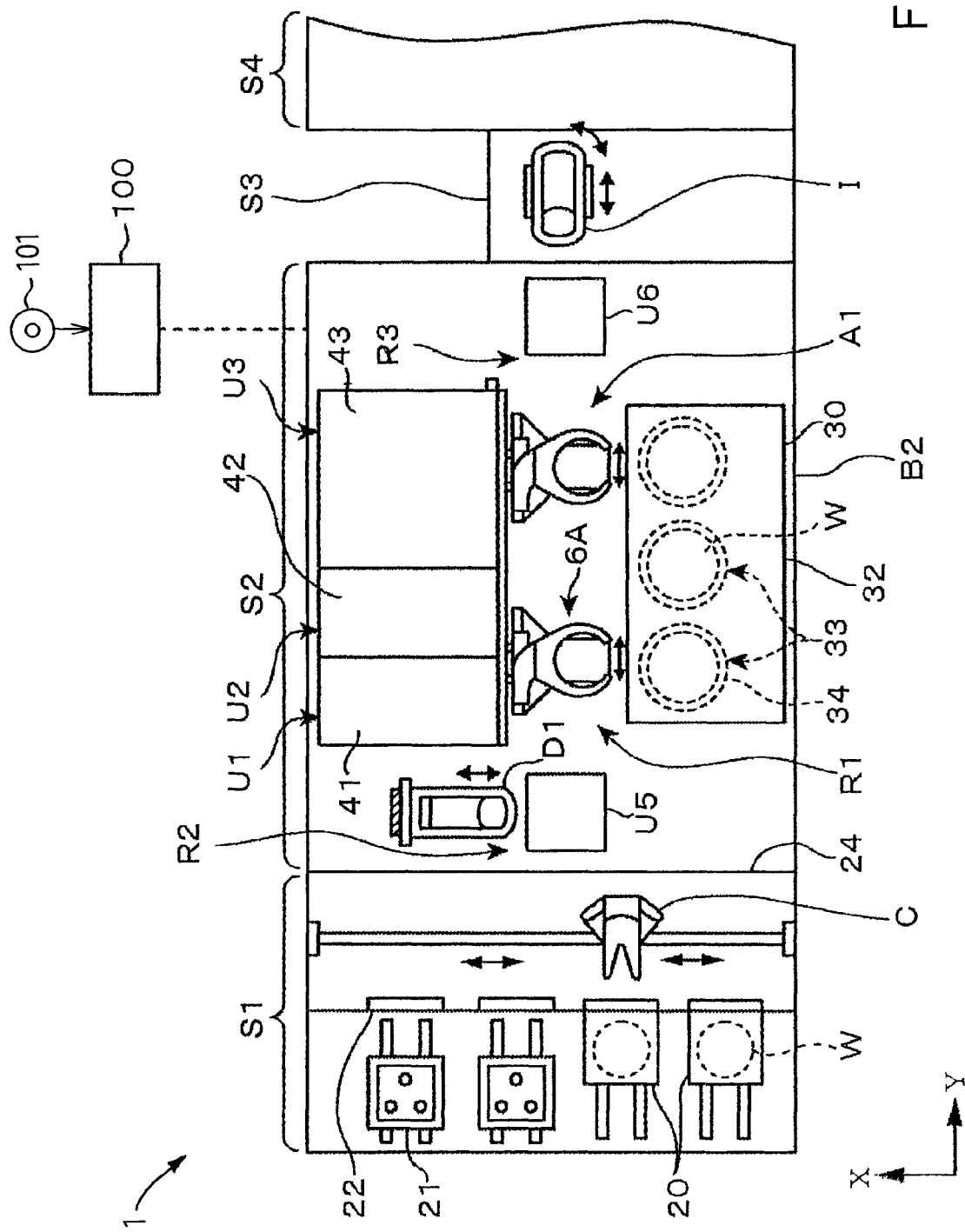
FIG. 1 is a cross-sectional view of a first embodiment of a coating and developing apparatus of the present invention, showing a developing process part of the coating and developing apparatus.
Figure 2:
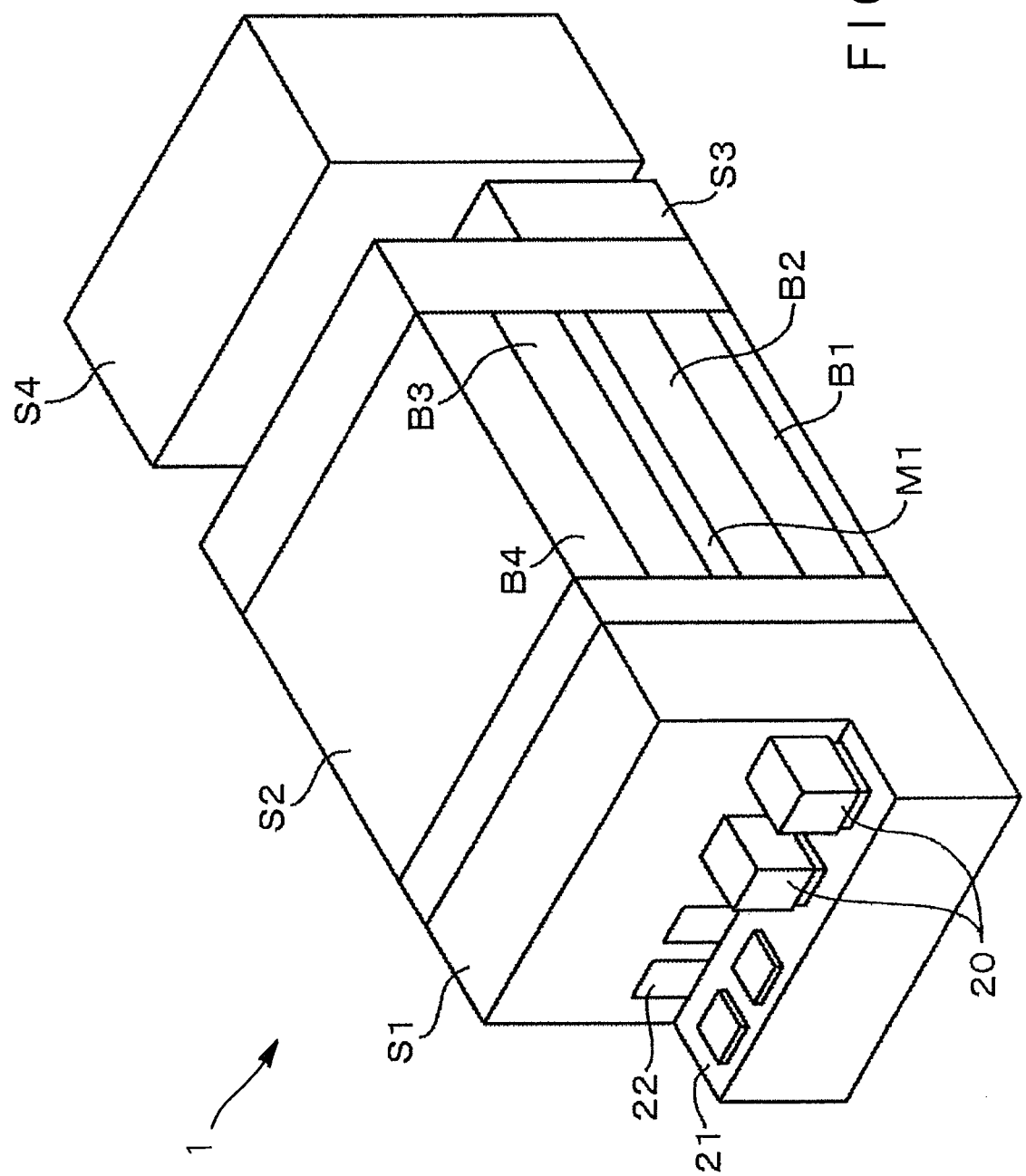
FIG. 2 is a perspective view of the coating and developing apparatus shown in FIG. 1.

A first embodiment is described with reference to FIGS. 1 to 5. FIGS. 1 and 2 show a system in which an exposure apparatus is connected to a developing apparatus. The coating and developing apparatus 1 includes a carrier block (carrier area) S1 on which a carrier 20 capable of hermetically containing a plurality of substrates (e.g., thirteen wafers W), a process block (process area) S2 having a plurality of, e.g., four parts (four sections) B1 to B4 and a direct transfer part (direct transfer section) M1 arranged along a longitudinal direction of the overall system, and an interface block (interface area) S3. An exposure apparatus S4 is connected to the interface block S3.

The carrier block S1 accommodates a table 21 on which a plurality of carriers 20 can be placed, opening and closing parts 22 formed in a wall surface ahead the table 21, and a conveying arm (transfer mechanism for the carrier block) C capable of taking out the wafer W from the carrier 20 through the opening and closing part 22 and delivering the wafer W to the carrier 20 through the opening and closing part 22. The conveying arm C is configured to deliver the wafer W to and receive the wafer W from the transfer unit TRS1 corresponding to developing parts (DEV layers) B1 and B2, a transfer unit TRS1B corresponding to the direct transfer part M1, and a transfer unit TRS3 corresponding to a coating film forming part (BCT layer) B3. To be specific, the conveying arm C can move in a front and rear direction and an up and down direction (vertical direction), rotate about the vertical axis, and move in a direction in which the carriers 20 are arranged.

Figure 3:
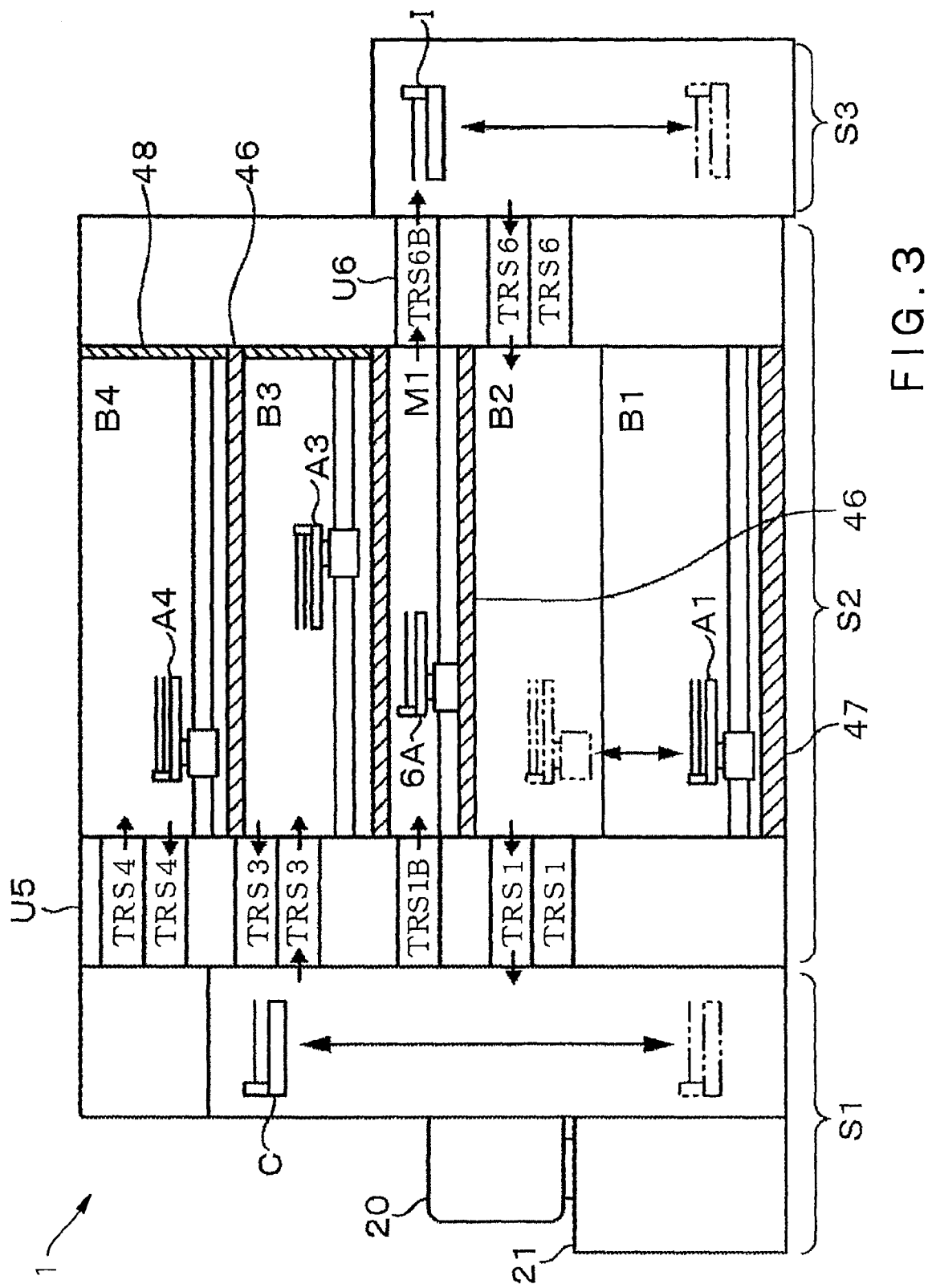
FIG. 3 is a vertical sectional view of the coating and developing apparatus shown in FIG. 1.

The process block S2 surrounded by a housing 24 is connected to the carrier block S1 at a rear side of the carrier block S1. The process block S2 accommodates a plurality of coating film forming parts (coating film forming sections) B3 and B4 each for forming a coating film on the wafer W, the developing parts (developing sections) B1 and B2 each for developing the wafer W, and the direct transfer part M1 for directly transferring the wafer W from a side of the carrier block S1 to a side of the interface block S3. The coating film forming parts B3 and B4, the developing parts B1 and B2, and the direct transfer part M1 are vertically arranged in a stacking manner. As shown in FIG. 3, in this embodiment, the following sections are stacked in the following order from the bottom. Namely, there are stacked: a first unit section (developing part: DEV layer) B1 for conducting a developing process; a second unit section (developing part: DEV layer) B2 for conducting a developing process; a transfer section (direct transfer part) M1, a third unit section (coating film forming part: BCT layer) B3 for forming an antireflection film (referred to as "lower antireflection film" below) on a lower side of a resist film; and a fourth unit section (coating film forming part: COT layer) B4 for conducting an application process of a resist liquid. These unit sections B1 to B4 and the transfer section M1 extend in the process block S2 from the side of the carrier block S1 toward the side of the interface block 3.

The DEV layers B1 and B2 correspond to the developing parts, and the BCT layer B3 and the COT layer B4 correspond to the coating film forming parts for forming a coating film formed of a photosensitive material such as a resist. Partition plates (base members) 46 are respectively interposed between the DEV layer (developing part) B2 and the direct transfer part M1, between the direct transfer part M1 and the BCT layer (coating film forming part) B3, and between the BCT layer (coating film forming part) B3 and the COT layer (coating film forming part) B4.

Next, structures of the respective parts B (B1 to B4) will be described below. In this embodiment, the respective parts B1 to B4 include many common portions, and the respective parts B have substantially the same layout. At first, the DEV layers B1 and B2 are described with reference to FIGS. 1 to 4, and then structures of other layers different from those of the DEV layers B1 and B2 are mainly described.

As described in FIGS. 1 to 4, a transfer path R1 for the wafer W connecting the carrier block S1 and the interface block S3 to each other is formed in a center part of the DEV layer B1 in a lateral direction, more specifically, in a longitudinal direction (Y direction in the drawings) of the DEV layers B1 and B2. Developing units 31 and 32 having a plurality of applying parts for applying a developing liquid are vertically stacked as liquid process units along the transfer path RI on a right side thereof, when the developing unit 31 and 32 are viewed from the front side (the side of the carrier block S1) of the transfer path R1. In this embodiment, the DEV layers B1 and B2 are not separated from each other but are integrally formed. However, as a matter of convenience, a horizontal section including the developing unit 31 is referred to as the DEV layer B1, and a horizontal section including the developing unit 32 is referred to as the DEV layer B2.

Each of the developing units 31 and 32 is structured as a liquid process unit for developing an exposed wafer W, and is provided with a housing 30. A plurality of, e.g., three developing parts 33 are disposed in the respective housings 30. The developing part 33 includes a wafer holder for holding and rotating the wafer W, a cup 34 surrounding the wafer holder, and so on. In the developing part 33, a developing liquid is supplied from a not-shown chemical liquid nozzle to a surface of the wafer W to form thereon a liquid film of the developing liquid, so that the surface of the wafer W is developed. Thereafter, the developing liquid on the surface of the wafer W is washed away by means of a cleaning liquid supplied from a cleaning liquid supply mechanism, not shown, and then the wafer is rotated so as to be dried. In this manner, the developing process is finished. The reference number 30a depicts a slot through which the wafer W is transferred.

On the left side of the DEV layer B1 when viewed from the front side thereof, there are disposed three tier-like unit groups (three stacked-rack-like unit groups) U1, U2, and U3 in this order along the transfer path RI. The three tier-like unit groups U1, U2, and U3 include, in a stacking manner, thermal process units for a heating process and a cooling process that are performed before and after the wafer W is processed by the developing units 31 and 32, and an inspection unit for performing a predetermined inspection on the wafer W. Namely, the developing units 31 and 32 are opposed to the tier-like unit groups U1 to U3 with the transfer path R1 interposed therebetween. An evacuation unit 35 is disposed under the tier-like unit groups U1 to U3. The evacuation unit 35 is provided with a suction port 36 opened to the transfer path R1. Thus, the transfer path R1 can be evacuated through the suction port 36. The reference number 47 depicts a floor plate of the apparatus.

The thermal process unit includes, for example, a heating process unit for heating the exposed wafer W and heating the developed wafer W so as to dry the same, and a cooling process unit for adjusting a temperature of the wafer W at a predetermined one after the wafer W has been processed in the heating process unit. In this embodiment, three heating process units 41 are stacked to form the tier-like unit group U1, and three cooling process units 42 are stacked to form the tier-like unit group U2.

The tier-like unit group U3 is composed of, e.g., two stacked substrate inspection units 43 for inspecting the developed wafer W. Each of the substrate inspection units 43 may be a unit of devices such as: a defective inspection device for detecting a failure and impairment in the developing process; a foreign matter inspection device for inspecting a foreign matter on a substrate surface; a line-width measuring device for measuring a line width (CD) of a pattern in a resist film formed on a substrate; an overlapping condition inspection device for inspecting a precision of an overlapping condition of an exposed substrate and a photomask; a residue inspection device for detecting a resist residue remaining on a developed substrate; and a defocus inspection device for detecting an off-position of a pattern caused by an exposure apparatus. In accordance with a desired inspection, a suitable unit can be formed by selecting the appropriate devices. Practically, the number of inspection units 43 and a layout thereof are determined depending on a desired inspection and an accommodating space therefor.

The heating process units 41, the cooling process units 42, and the inspection units 43 respectively have housings each of which is provided on its front surface facing the transfer path R1 with a transfer slot 40 through which the wafer W is delivered and received.

Figure 4:
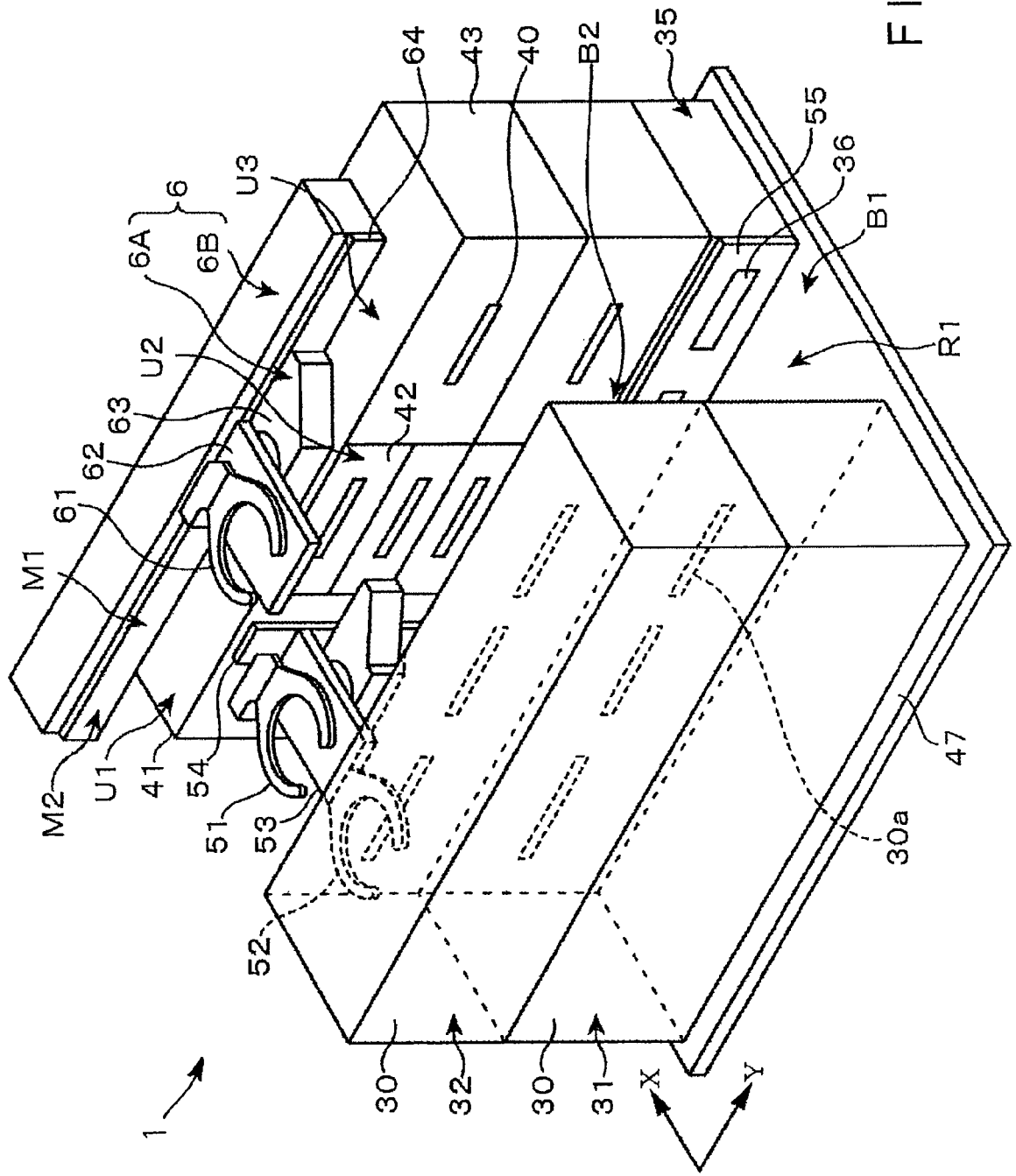
FIG. 4 is a perspective view of the developing part (DEV layer) and a direct transfer part of the coating and developing apparatus shown in FIG. 1.

As shown in FIG. 4, a main arm (transfer mechanism for the developing part) A1 for transferring the wafer W in the DEV layers B1 and B2 is disposed on the transfer path R1. The main arm A1 is configured to deliver the wafer W to and receive the wafer W from the process units 41 in the tier-like unit group U1, the process units 42 in the tier-like unit group U2, the inspection units 43 in the tier-like unit group U3, the developing units 31 and 32, the below-described tier-like unit group (first transfer unit group) U5, and the below-described tier-like unit group (second transfer unit group) U6. The main arm A1 has, for example, two arm members 51 and 52 each for supporting a peripheral region of the rear surface of the wafer W, and a transfer base member 53 for supporting the arm members 51 and 52. The arm members 51 and 52 are configured to independently move forward and rearward above the transfer base member 53. The reference numbers 54 and 55 depict guide rails for guiding the transfer base member 53. The guide rail 54 is supported by the guide rail 55. The transfer base member 53 is capable of vertically moving along the guide rail 54, moving along the guide rail 55, and rotating about the vertical axis.

Next, the direct transfer part M1 is described with reference to FIGS. 1, 3, and 4. The direct transfer part M1 is interposed between the DEV layers B1 and B2, and the BCT layer B3. Through the direct transfer part M1, the wafer W is directly transferred from the side of the carrier block S1 to the side of the interface block S3. The direct transfer part M1 is separated from the transfer path R1 in the DEV layers (developing parts) B1 and B2, and the transfer path R1 in the BCT layer (coating film forming part) B3, by means of partition plates, respectively. The direct transfer part M1 includes a transfer area M2 and a shuttle arm (direct transfer mechanism) 6. For the matter of convenience, the partition plate 46 is omitted in FIG. 4.

The shuttle arm 6 has, for example, a moving part 6A and a driving part 6B. The moving part 6A is configured to move along the transfer area M2 parallel to the transfer path R1, for example. The moving part 6A has, e.g., an arm member 61 for supporting a peripheral region of the rear surface of the wafer W, the arm member 61 being capable of moving forward and rearward above a transfer base member 62. The transfer base member 62 is disposed on a moving base member 63 such that the transfer base member 62 can rotate about the vertical axis. If a space allows, a mechanism for vertically moving the transfer base member 62 can be provided. The reference number 64 depicts a guide rail disposed on the driving part 6B. The guide rail 64 extends along the transfer area M2 and has a function to guide the moving part 6A in the lateral direction. The moving part 6A transfers the wafer W between the transfer unit TRS1B provided in the tier-like unit group (first transfer unit group) U5 and the transfer unit TRS6B provided in the tier-like unit group (second transfer unit group) U6.

In the transfer path R1 and the transfer area M2, an area adjacent to the carrier block S1 provides a first wafer transfer area R2. As shown in FIGS. 1 and 3, in the area R2, there are disposed the tier-like unit group (first transfer unit group) U5 at a position where the main arm A1, the moving part 6A of the shuttle arm 6, and the conveying arm C can access, and a vertically movable transfer arm (transfer mechanism for the first transfer unit) for transferring the wafer W to and from the tier-like unit group U5.

The tier-like unit group U5 includes: the transfer unit TRS1B arranged at a height position corresponding to the direct transfer part M1; a plurality of, e.g., two transfer units TRS1 arranged at height positions corresponding to the DEV layers B1 and B2; a plurality of, e.g., two transfer units TRS3 arranged at height positions corresponding to the BCT layer B3; and a plurality of, e.g., two transfer units TRS4 arranged at height positions corresponding to the COT layer B4. The conveying arm C, the moving part 6A of the shuttle arm 6, and the transfer arm D1 can respectively access the transfer unit TRS1B. The main arm A1, the conveying arm C, and the transfer arm D1 can respectively access the transfer units TRS1.

Each of the transfer units TRS1 and the transfer unit TRS1B has a housing of, e.g., a cuboid shape (rectangular solid shape), a table disposed in the housing to support the wafer W, and a pin projectable from the table and retractable therein. The table has a mechanism for adjusting a temperature of the wafer W supported on the table at a set temperature. The wafer is transferred among the respective transfer units via transfer slots formed in side surfaces of the housings facing the respective arms. Specifically, each of the arms enters through the transfer slot the housing where the wafer W is supported by a pin such that the wafer W is apart from the table, and picks up the wafer W from the rear surface thereof. Alternatively, each of the arms brings the wafer W into the housing through the transfer slot, and places the wafer W on the pin projecting from the table.

As described above, the two transfer units TRS3 are arranged at height positions corresponding to the BCT layer B3, and the two transfer units TRS4 are arranged at height positions corresponding to the COT layer B4 (see, FIG. 3). All the transfer units TRS3 and TRS4 have the same structure as that of the above-described transfer units TRS1 and TRS1B. The transfer units TRS3 are configured such that the main arm A3 disposed on the layer B3 and the transfer arm D1 can transfer the wafer W to and from the transfer units TRS3. The transfer units TRS4 are configured such that the main arm A4 disposed on the layer B4 and the transfer arm D1 can transfer the wafer W to and from the transfer units TRS4. In addition, the transfer units TRS3 corresponding to the BCT layer are configured such that not only the above arms but also the conveying arm C can transfer the wafer W to and from the transfer units TRS3. The number of the transfer units TRS is not limited, and more than one transfer units TRS may be disposed for each block.

The transfer arm D1 can be vertically moved to a height corresponding to each layer. In addition, the transfer arm D1 can be moved closer to and away from the transfer units TRS1 to TRS4 and TRS1B disposed on the corresponding layers. Thus, the transfer arm D1 can deliver the wafer W to and receive the wafer W from the transfer units TRS1 to TRS4 and TRS1B disposed on the corresponding layers. In this example, the transfer units TRS1, TRS3, and TRS1B are configured such that the conveying arm C can transfer the wafer W to and from the transfer units TRS1, TRS3, and TRS1B.

In the transfer path R1 of the DEV layers B1 and B2 and the transfer area M2 of the direct transfer part M1, an area adjacent to the interface block B3 provides a second wafer transfer area R3. As shown in FIG. 3, the tier-like unit group (second transfer unit group) U6 is disposed in the area R3. In the transfer unit group U6, a transfer unit TRS6B is arranged at a height position corresponding to the direct transfer part M1, and a transfer unit TRS6 is arranged at a height position corresponding to the DEV layers B1 and B2. The transfer unit TRS6B is configured such that the shuttle arm 6 and an interface arm I can transfer the wafer W to and from the transfer unit TRS6B. The transfer unit TRS6 is configured such that the main arm A1 and the interface arm I can transfer the wafer W to and from the transfer unit TRS6. The transfer units TRS6B and TRS6 have the same structure as that of the above-described transfer units TRS1B and TRS1, for example, and have a function for cooling the wafer W so that a temperature of the wafer W received by the transfer units TRS6B and TRS6 can be adjusted.

The interface block S3 is disposed behind the tier-like unit group U6 in the process block S2. The interface block S3 is connected to the exposure apparatus S4. The interface block S3 has the interface arm (transfer mechanism for the interface block) I that transfers the wafer W between the tier-like unit group U6 in the process block S2 and the exposure apparatus S4. The interface arm I is configured to be capable of moving forward and rearward, moving in the up and down direction, and rotating about the vertical axis. The above-described transfer arm D1 may be structured in the same manner as the interface arm I. However, different from the interface arm I, the transfer arm D1 can be structured such that the transfer arm D1 cannot rotate about the vertical axis.

The interface arm I serves as a transfer mechanism for the wafer W, and is interposed between the process block S2 and the exposure apparatus S4. Namely, the interface arm I is configured to receive the wafer W from the transfer unit TRS6B corresponding to the direct transfer part M1, and to deliver the received wafer W to the exposure apparatus S4. On the other hand, the interface arm I is also configured to receive the wafer W from the exposure apparatus S4, and to deliver the received wafer W to the transfer unit TRS6.

The BCT layer B3 and the COT layer B4 are briefly described below. The BCT layer B3 and the COT layer B4 have substantially the same structure as that of the DEV layers B1 and B2. However, different from the DEV layers B1 and B2 in which a developing liquid is used as a chemical liquid of the liquid process unit, a chemical liquid for forming an antireflection film or a chemical liquid (resist liquid) for forming a resist film is used in the BCT layer B3 and the COT layer B4. An application manner of the chemical liquid in the BCT layer B3 and the COT layer B4 is different from the application manner in the DEV layers B1 and B2. Process conditions in heating and cooling process units in respective tier-like unit groups in the BCT layer B3 and the COT layer B4 are also different from the process conditions in the DEV layers B1 and B2. In addition, no transfer unit of the tier-like unit group U6 is disposed on the side of the BCT layer B3 and the COT layer B4 near the interface block S3. As shown in FIG. 3, a shielding plate 48 is disposed to separate the transfer path R1 from a region corresponding to the wafer transfer area R3.

Each of the BCT layer B3 and the COT layer B4 is provided with an evacuation unit 35. A plurality of, e.g., four tier-like unit groups are disposed on the evacuation unit 35 along the transfer path R1. Each of the tier-like unit groups is composed of two vertically stacked process units. In addition to the above-described cooling process unit and heating process unit, process units constituting the tier-like unit groups of the COT layer B4 include a unit for making the wafer W hydrophobic, a peripheral exposure unit for exposing a periphery of the wafer W, and a substrate inspection unit for inspecting the wafer W on which a resist film has been formed.

Each of the substrate inspection units of the COT layer B4 may be a unit of devices such as: a defective inspection device, a film-thickness measuring device for measuring a film-thickness of a resist film; an inspection device for inspecting a coating unevenness in a surface; a foreign matter inspection device for detecting particles (foreign matter) on a substrate; a substrate deflection inspection device for obtaining data regarding a deflection in a wafer; a comet detecting device for detecting a comet on a surface of the resist-coated wafer W, the comet being caused by bubbles and foreign matters in a resist liquid; a splash-back detecting device for detecting a splash-back which is a readhesion of a solvent of a resist liquid splashing from a surface of the wafer W; and a coating ununiformity detecting device for detecting a coating ununiformity of a resist liquid. In accordance with a desired inspection, a suitable unit can be formed by selecting the appropriate devices.

As other process units constituting the tier-like unit group of the COT layer B4, there can be selected a unit of process devices such as a substrate identification title exposure device for conducting a laser process on the wafer W so as to create a predetermined identification code, and a laser ablation device for sublimating a resist covering an alignment mark of the wafer W by a laser so as to expose the mark. Herein, these devices constituting a process unit are categorized as the above-described unit for performing the predetermined inspection, and are collectively referred to as the substrate inspection unit.

The coating and developing apparatus 1 includes a control device 100 formed of, e.g., a computer and having a program storing part. The program storing part stores a computer program of, e.g., a software for issuing commands for executing operations of the coating and developing apparatus 1, such as process of the wafer W, transfer of the wafer W, and management of a recipe of a transfer path. The control device 100 reads the program so as to control an operation of the coating and developing apparatus 1. The program, which is recorded in a storage medium such as a hard disc, a compact disc, a magnet optical disc, and a memory card, is stored in the program storing part.

An example of a method for processing a wafer W by means of the coating and developing apparatus 1 is described below. At first, the carrier 20 is loaded from outside into the carrier block S1. The conveying arm C takes the wafer W out of the carrier 20. The wafer W is transferred from the conveying arm C, to the transfer unit TRS3 of the tier-like unit group U5, the main arm A3 of the BCT layer B3, the cooling process unit, the main arm A3, the lower-antireflection-film forming unit (although not shown, this unit is a liquid process unit corresponding to the developing units 31 and 32 in FIG. 4), the main arm A3, the heating process unit, the main arm A3, the cooling process unit, the main arm A3, and the transfer unit TRS3 of the tier-like unit group U5, in this order, so that a lower antireflection film is formed on the wafer W.

Subsequently, the wafer W received by the transfer unit TRS3 is transferred to the transfer arm D1, the transfer unit TRS4 facing the COT layer B4, the main arm A4 of the COT layer B4, the main arm A4 of the COT layer B4, the cooling process unit, the main arm A4, the hydrophobic process unit, the main arm A4, the cooling process unit, the main arm A4, the resist applying unit (although not shown, the unit is a liquid process unit corresponding to the developing units 31 and 32 in FIG. 4), the main arm A4, and the heating process unit, in this order, so that a resist film is formed on an upper surface of the lower antireflection film of the wafer W. Thereafter, the wafer W is transferred by the main arm A4 to the peripheral exposure unit where a periphery of the wafer W is exposed.

All the wafers W having their peripheries being exposed, or the wafer W selected from these wafers W are transferred by the main arm A4 to the respective substrate inspection units of the COT layer B4, and are sequentially subjected to predetermined inspections such as an inspection for inspecting a film-thickness of the resist film and an inspection for inspection particles on a surface of the resist film. Thereafter, the wafer W is transferred by the main arm A4 to the transfer unit TRS4 of the tier-like unit group U5. Then, the wafer W in the transfer unit TRS4 is transferred to the transfer arm D1, the transfer unit TRS1B, the shuttle arm 6, the transfer unit TRS6B, the interface arm I, and the exposure apparatus S4, in this order. The wafer W is subjected to a predetermined exposure process in the exposure apparatus S4.

The exposed wafer W is transferred to the interface arm I, the transfer unit TRS6, the main arm A1 of the DEV layers B1 and B2, the heating process unit 41, the main arm A1, the cooling process unit 42, the main arm A1, the developing unit 31 (32), the main arm A1, the heating process unit 41, the main arm A1, and the cooling process unit 42, in this order, so that the wafer W is subjected to a predetermined developing process. The thus developed wafer W is transferred by the main arm A1 to the respective substrate inspection units 43 of the tier-like unit group U3, and is sequentially subjected to predetermined inspections. Thereafter, the inspected wafer W is transferred by the main arm A1 to the transfer unit TRS1 of the tier-like unit group U5. Then, the wafer W is returned by the conveying arm C to the original carrier 20 placed on the carrier block S1.

Figure 5:
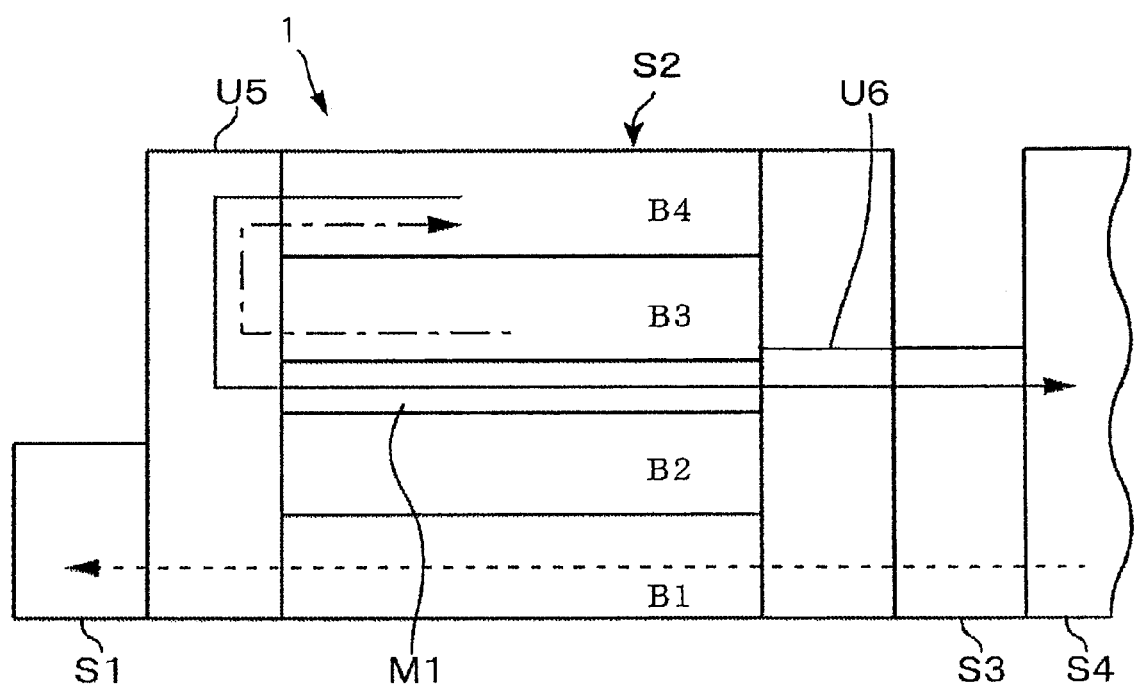
FIG. 5 is a schematic view showing an example of a transfer path of a substrate, when a substrate is processed by the coating and developing apparatus shown in FIG. 1.
Figure 6:
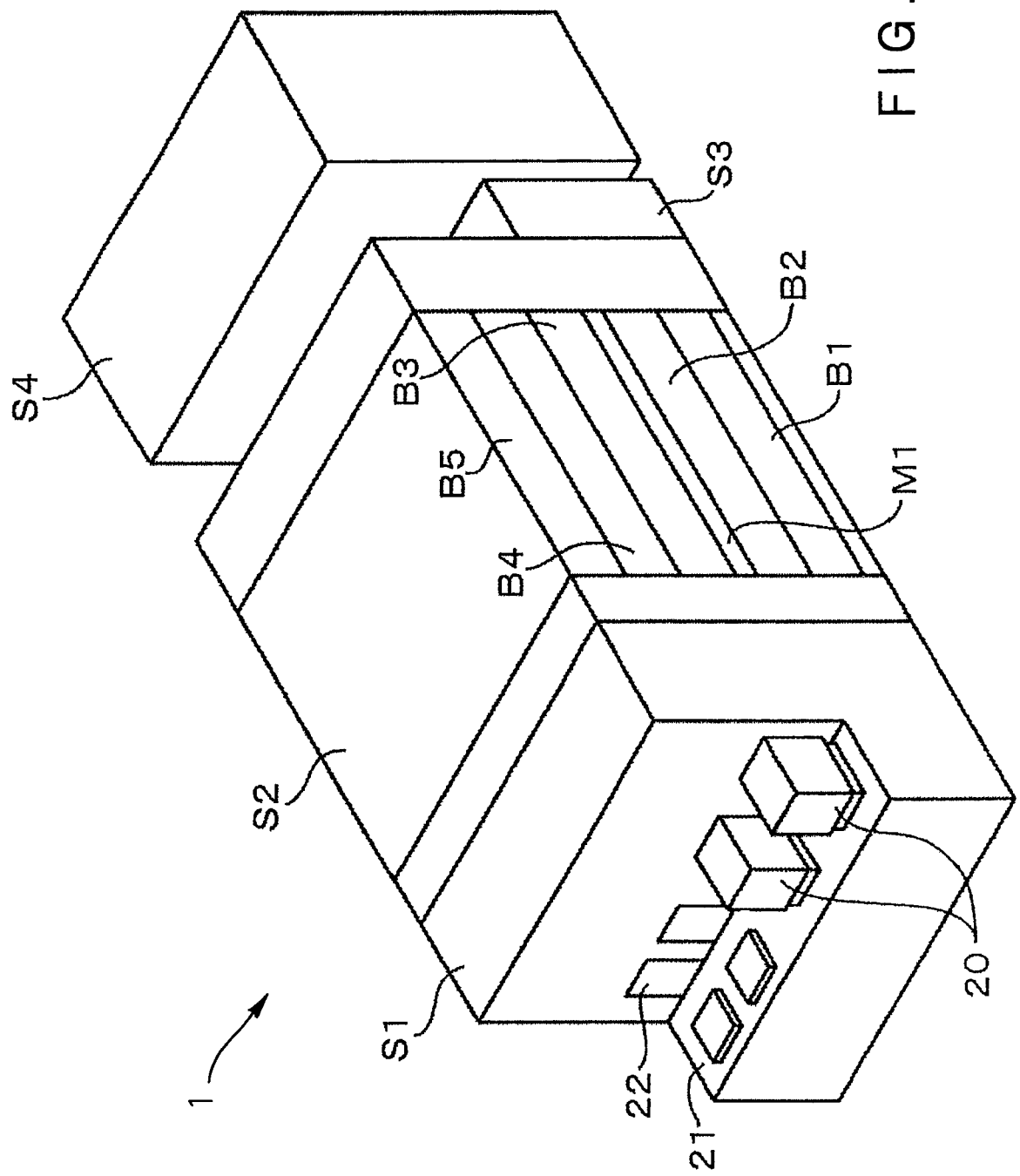
FIG. 6, which corresponds to FIG. 2, is a perspective view of a second embodiment of a coating and developing apparatus of the present invention.

FIG. 5 schematically shows the above-described path through which the wafer W is transferred. As indicated by the chain line arrow, the wafer W is moved between the coating film forming parts B3 and B4 so that a coating film is formed on the wafer W. Then, the wafer W is subjected to a predetermined pre-exposure inspection by the substrate inspection unit of the COT layer (coating film forming part) B4 (step 1). After that, as indicated by the solid line arrow, the wafer W is transferred by the shuttle arm 6 in the carrier block S2 from the side of the carrier block S1 to the side of the interface block S3 through the direct transfer part M1, and further transferred to the exposure apparatus S4 (step 2). As indicated by the dotted line arrow, the exposed wafer W is transferred from the exposure apparatus S4 to the DEV layers (developing process parts) B1 and B2 where the substrate W is subjected to a developing process, then the substrate W is transferred to the substrate inspection unit 43 to be subjected to the above-described post-developing process inspection, and finally the wafer W is returned to the carrier block S1 (step 3).

In the coating and developing apparatus 1 in this embodiment, there are vertically stacked the COT layer B4 as a unit section for applying a resist film, the COT layer B4 including the substrate inspection unit 44, and the DEV layers B1 and B2 as unit sections for developing the wafer W, the DEV layers B1 and B2 including the substrate inspection unit 43. Thus, the disadvantageous layout of the apparatus, that is to say, the outward protrusion of the respective substrate inspection units from the body of the coating and developing apparatus can be avoided. Further, an installation space required for the coating and developing apparatus 1 can be narrowed.

The direct transfer part M1 through which the wafer W on which a resist film has been formed is directly transferred from the first transfer unit group U5 near the carrier block S1 to the second transfer unit group U6 near the interface block S3 is stacked on the COT layer B4 and the DEV layers B1 and B2. Thus, there is no need for the main arms A4, A3, and A1 of the respective COT layer B4, the BCT layer B3, and the DEV layers B1 and B2 to transfer the wafer W toward the interface block S3. Due to this structure, loads applied to the main arms A4, A3, and A1 can be reduced, and a transfer efficiency can be elevated, which results in an improvement in throughput.

The number of layers as the unit sections B is not limited to four, and another unit section may be disposed for forming a coating film other than a lower antireflection film or a resist film. Also, the vertical arrangement order of the unit sections B1 to B4 and the direct transfer part M1 is not limited to the above order. For example, the unit area B3 may be a COT layer, and the unit area B4 above the unit area B3 may be a BCT layer.

A function of the shuttle arm 6 is to directly transfer a substrate from the transfer unit near the carrier block to the interface block, bypassing the process unit for a coating process and the process unit for a developing process. Even when the transfer units for a substrate are arranged in the course of the transfer path, as in the above-described embodiment, the shuttle arm 6 is a concept including a case in which the substrate is transferred via these units between the shuttle arm 6 and the transfer mechanism in the interface block (transfer mechanism for the interface block).

Next, a second embodiment will be described with reference to FIGS. 6 to 9. In FIGS. 6 to 9, the same parts as those of the first embodiment are shown by the same reference numbers, and the overlapping detailed description is omitted.

Figure 8:
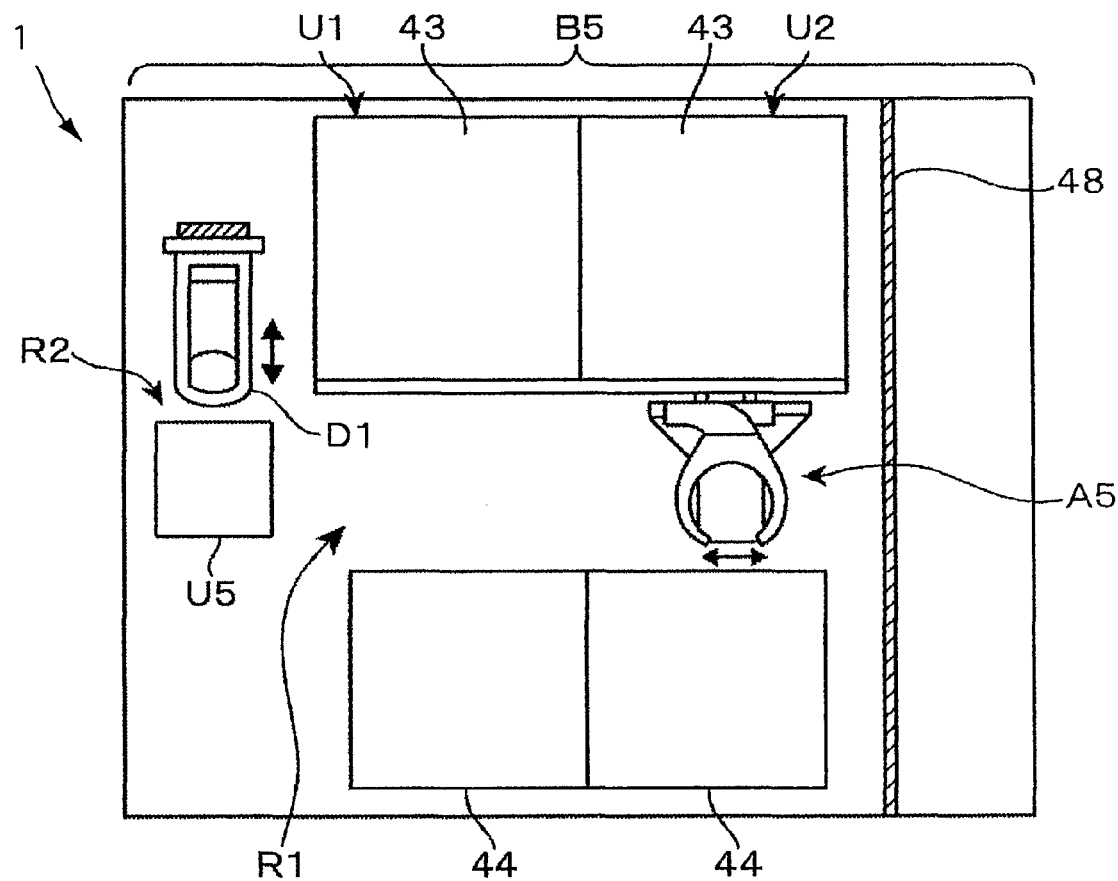
FIG. 8 is a cross-sectional view of a substrate inspection part of the coating and developing apparatus shown in FIG. 6.

In a coating and developing apparatus 1 in this embodiment, a substrate inspection part B5 as a fifth unit section is stacked above a COT layer B4. FIG. 8 is a cross-sectional view of the substrate inspection part B5 in the coating and applying apparatus 1. The substrate inspection part B5 has substantially the same structure as that of the respective parts B1 to B4. A different structure from the parts B1 to B4 is that the substrate inspection part B5 neither has a liquid process unit nor a thermal process unit for a heating process or a cooling process conducted before and after a liquid process. That is to say, in the second embodiment, the substrate inspection units, which are placed in the COT layer B4 and the DEV layers B1 and B2 in the first embodiment, are collectively disposed in the substrate inspection part exclusively used for an inspection process.

Similar to the DEV layers B1 and B2 in the above embodiment, the substrate inspection part B5 has tier-like unit groups U1 and U2. Each of the tier-like unit groups U1 and U2 is composed of, e.g., two stacked substrate inspection units 43 which has been described above. A plurality of units such as substrate inspection units 44 for conducting various inspections for a wafer W on which a resist has been applied, and a peripheral exposure unit are stacked along a transfer path R on a side opposite to the tier-like unit groups U1 and U2. The substrate inspection unit 44 corresponds to the substrate inspection unit disposed on the COT layer B4 in the above embodiment, and includes a unit of devices such as the above-described substrate identification title exposure device, and the laser ablation device. Also in this embodiment, the number of substrate inspection units 43 and 44 and their layout can be optionally determined depending on a desired inspection, an installation space, and so on. The arrangement is not limited to the illustrated example, as long as a main arm A5 of the substrate inspection part B5 can access the substrate inspection units 43 and 44.

A clean air for removing particles is supplied, for example, from above to below into the substrate inspection part B5. A pressure in the substrate inspection part B5 is set slightly higher than a pressure in a clean room in which the coating and developing apparatus 1 is established (the substrate inspection part B5 has a positive pressure). Thus, an airflow is prevented from entering the substrate inspection part B5 from outside, whereby particles included in the airflow can be prevented from entering the coating and developing apparatus 1.

Figure 7:
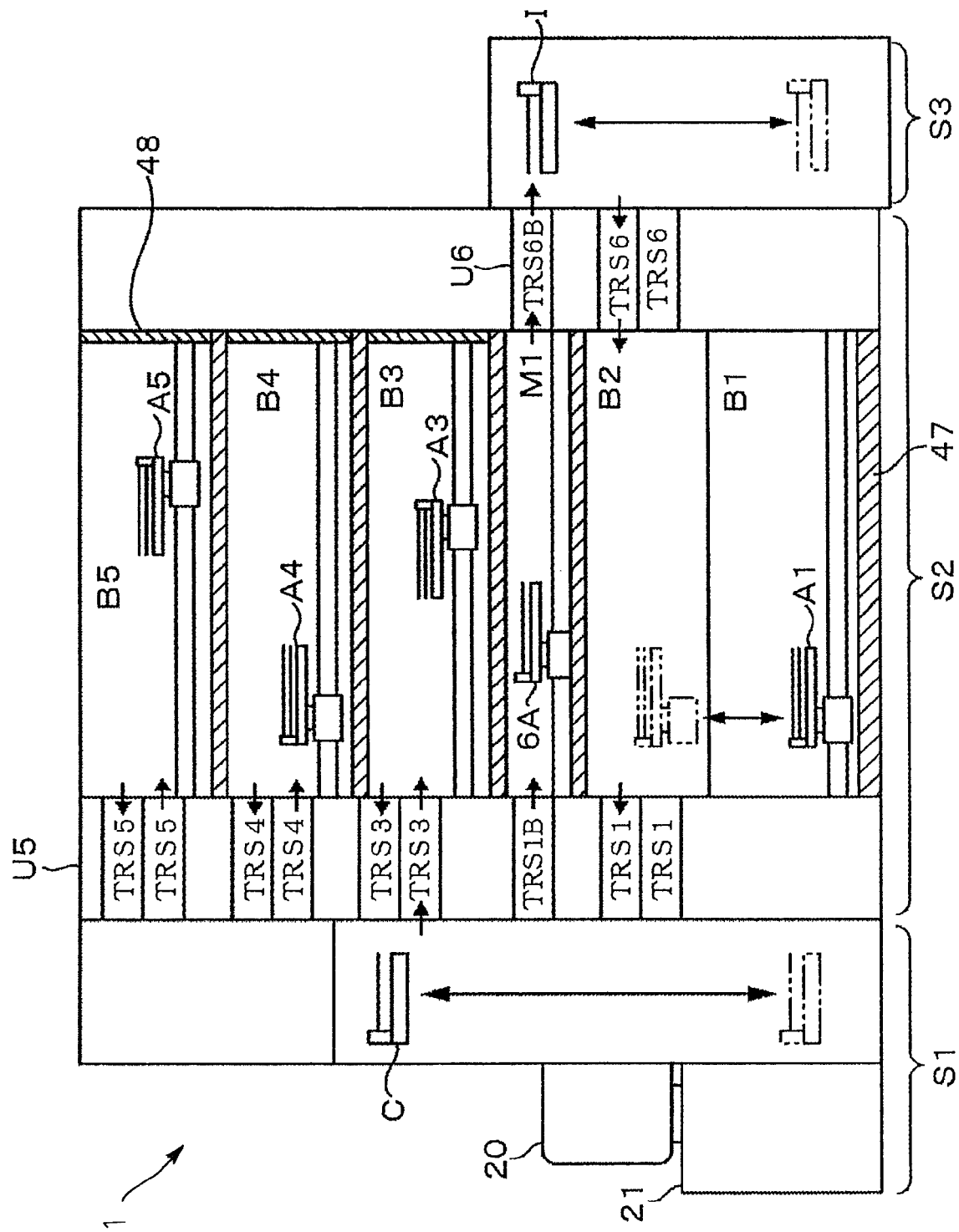
FIG. 7, which corresponds to FIG. 3, is a side sectional view of the coating and developing apparatus shown in FIG. 6.

As shown in FIG. 7, a transfer unit TRS5 is placed in a tier-like unit group U5 at a height position corresponding to the substrate inspection part B5. The main arm A5 and a transfer arm D1 can access the transfer unit TRS5.

In this coating and developing apparatus 1, a wafer W is loaded into the carrier block S1, and transferred through the same path as that of the first embodiment. After a lower antireflection film and a resist film are formed on a surface of the wafer W, the wafer W is transferred to a main arm A4 of a COT layer B4, a transfer unit TRS4 of the tier-like unit group U5, the transfer arm D1, the transfer unit TRS5, the main arm A5 of the substrate inspection part B5, a peripheral exposure unit, the main arm A5, and the substrate inspection unit 44 where the wafer W is sequentially subjected to predetermined inspections. Thereafter, the wafer W is transferred to the main arm A5, the transfer unit TRS5, the transfer arm D1, a transfer unit TRS1B, a shuttle arm 6, a transfer unit TRS6B, an Interface arm I, and an exposure apparatus S4, in this order.

The wafer W that has been exposed in the exposure apparatus S4 is transferred through the same path as that of the first embodiment. The wafer W is developed in the DEV layers B1 and B2, and is transferred to the transfer unit TRS1. Thereafter, the wafer W is transferred to the transfer arm D1, the transfer unit TRS5, the main arm A5, and the substrate inspection unit 43, in this order, and the wafer W is sequentially subjected to predetermined inspections in the substrate inspection unit 43. The inspected wafer W is transferred to the main arm A5, the transfer unit TRS5, the transfer arm D1, and the transfer unit TRS1, in this order, and then the wafer W is returned to a carrier 20 through the same path as that of the above embodiment.

Figure 9:
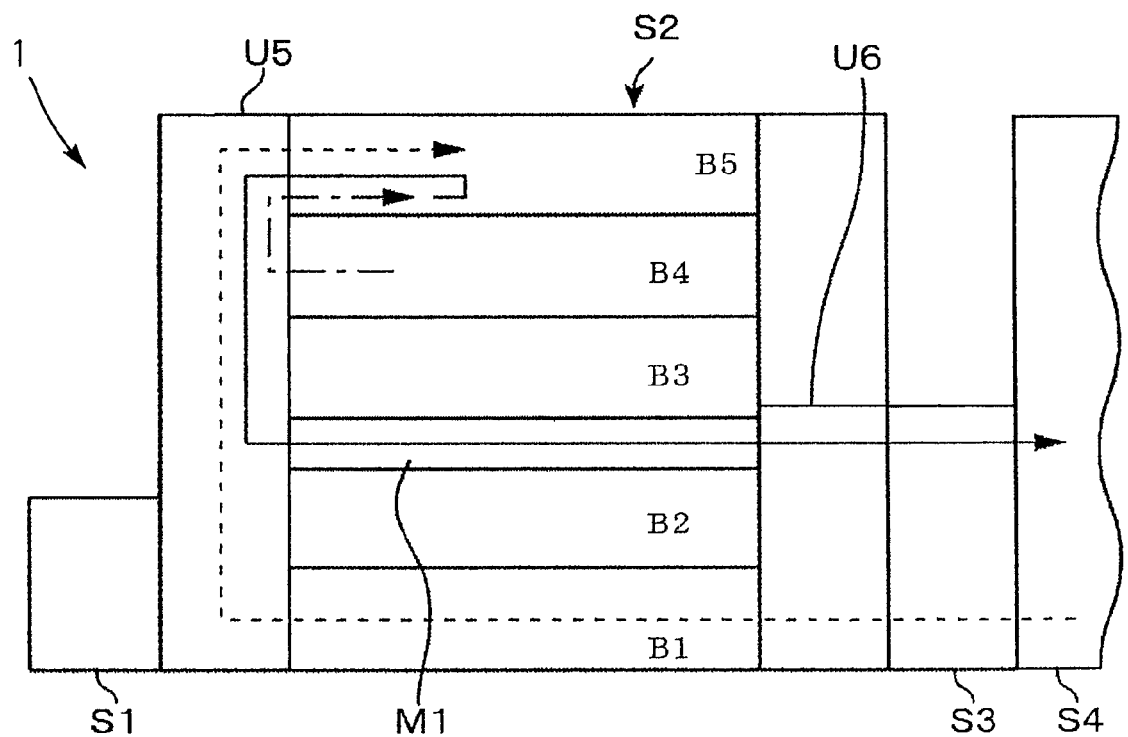
FIG. 9, which corresponds to FIG. 5, is a schematic view showing an example of a transfer path of a substrate, when a substrate is processed by the coating and developing apparatus shown in FIG. 6.

FIG. 9 is a view schematically showing a path through which the wafer W is transferred from a film forming part to an inspection part for a post-development inspection. The wafer W is moved between coating film forming parts B3 and B4 where a coating film is formed on the wafer W. Thereafter, as indicated by the chain line arrow, the wafer W is transferred to the substrate inspection part B5, and is subjected to a predetermined inspection before exposure in the substrate inspection unit 44 in the substrate inspection part B5 (step 1). Then, as indicated by the solid line arrow, the wafer W is transferred by the shuttle arm 6 in a process block S2 from the side of a carrier block S1 to the side of an interface block S3 through a direct transfer part M1, and is further transferred to the exposure apparatus S4 (step 2). After the wafer W is exposed, as indicated by the chain line arrow, the wafer W is transferred from the exposure apparatus S4 to the DEV layers B1 and B2 where the wafer W is developed, and the wafer W is transferred to the substrate inspection unit 43 where the wafer W is subjected to a predetermined inspection after development (S3). After that, the wafer W is returned to the carrier block S1.

In the coating and developing apparatus 1 in this embodiment, the substrate inspection part B5 having the substrate inspection units 43 and 44 is vertically stacked on the COT layer B4, the DEV layers B1 and B2, and the direct transfer part M1. Therefore, similar to the first embodiment, the disadvantageous layout of the apparatus, that is to say, the outward protrusion of the respective substrate inspection units from the body of the coating and developing apparatus can be avoided. Further, an installation space required for the coating and developing apparatus 1 can be narrowed.

The direct transfer part M1 through which the wafer W that has been inspected in the substrate process part B5 is directly transferred from a first transfer unit group U5 near the carrier block S1 to a second transfer unit group U6 near the interface block S3 is stacked on the respective parts B1 to B5. Thus, there is no need for the main arms A1, A3, A4, and A5 of the respective parts B1 to B5 to transfer the wafer W toward the interface block S3. Due to this structure, loads applied to the main arms A4, A3, and A1 can be reduced, and a transfer efficiency can be elevated, which results in an improvement in throughput.

Figure 10:
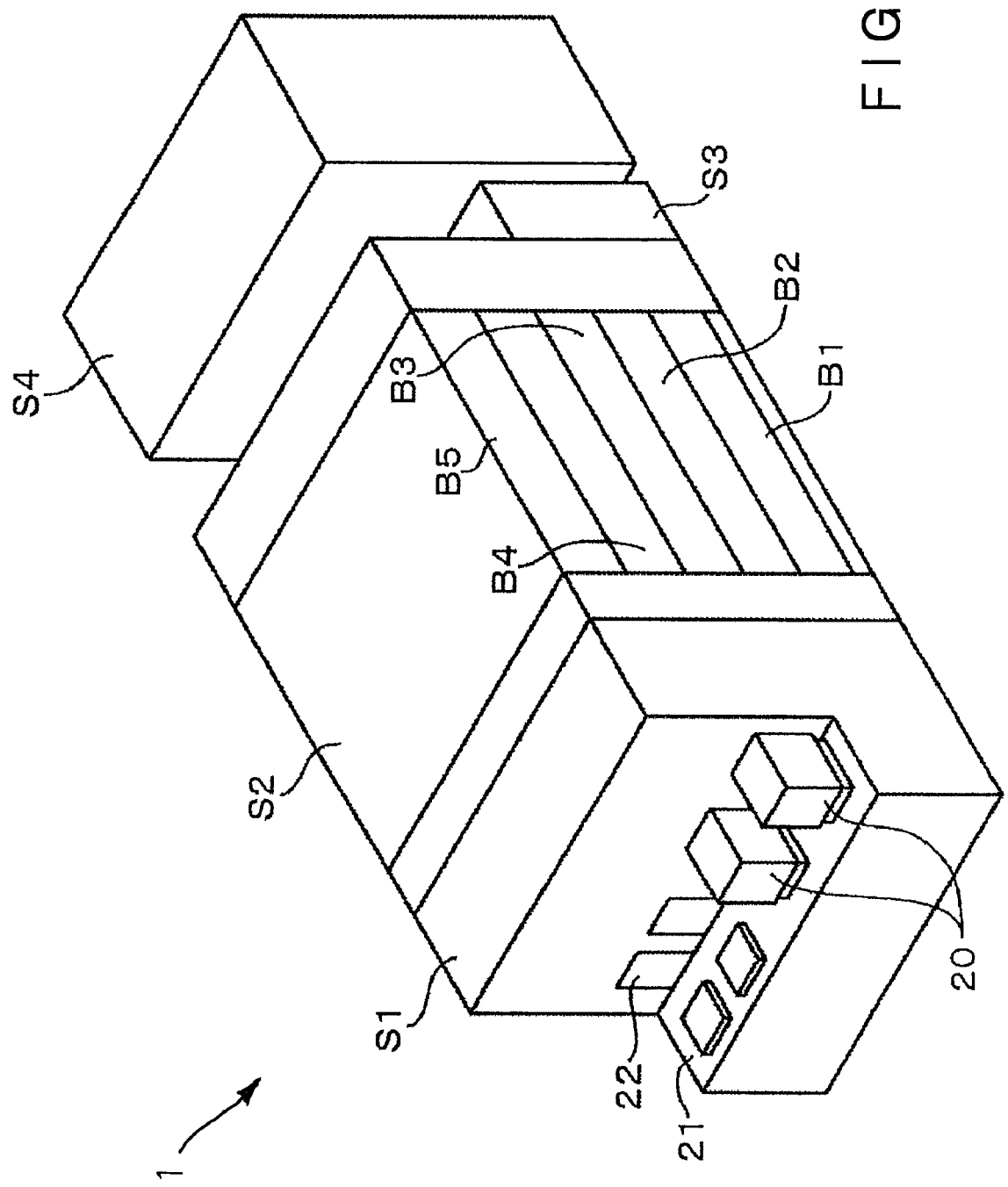
FIG. 10, which corresponds to FIG. 2, is a perspective view of a third embodiment of a coating and developing apparatus of the present invention.
Figure 11:
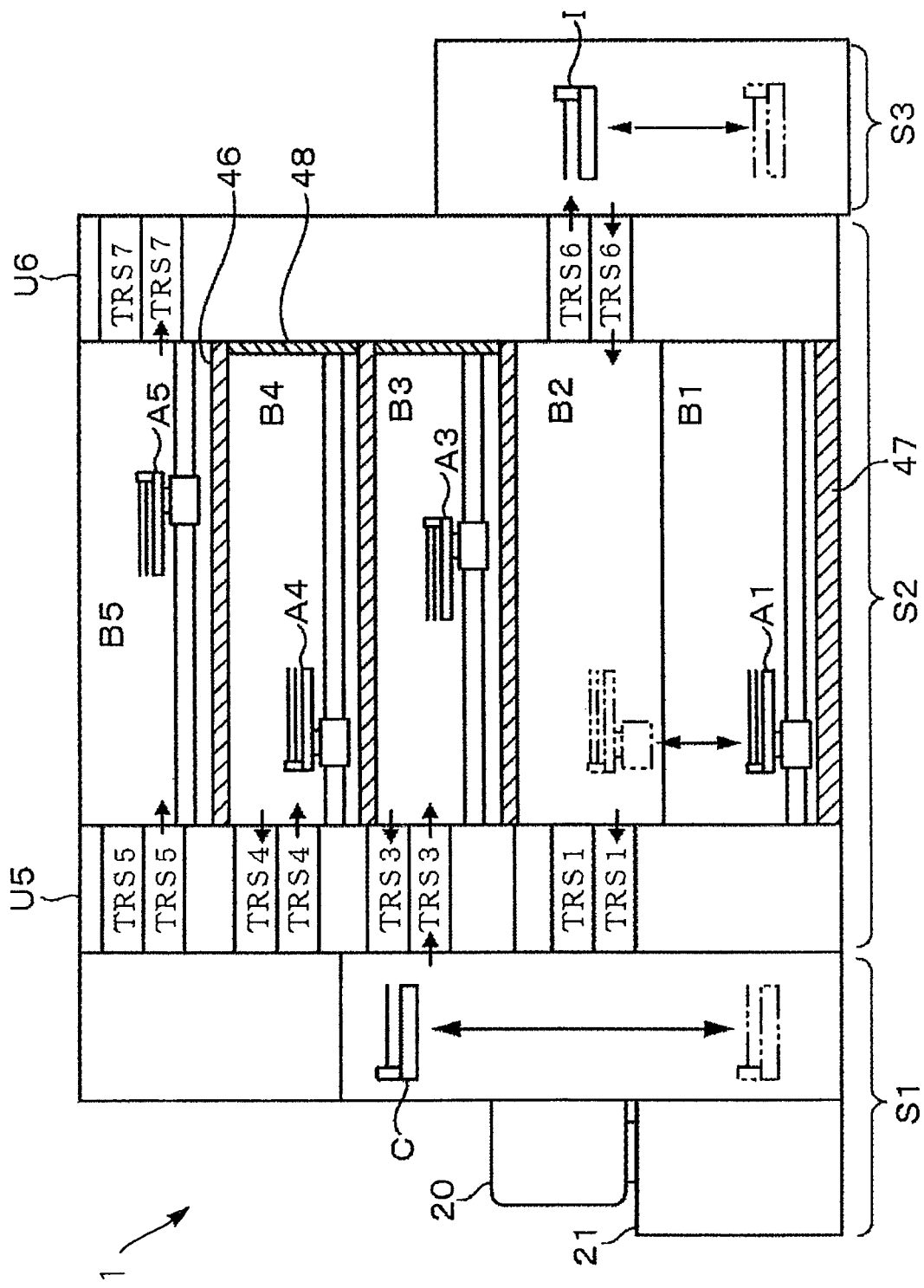
FIG. 11, which corresponds to FIG. 3, is a vertical sectional view of the coating and developing apparatus shown in FIG. 10.
Figure 12:
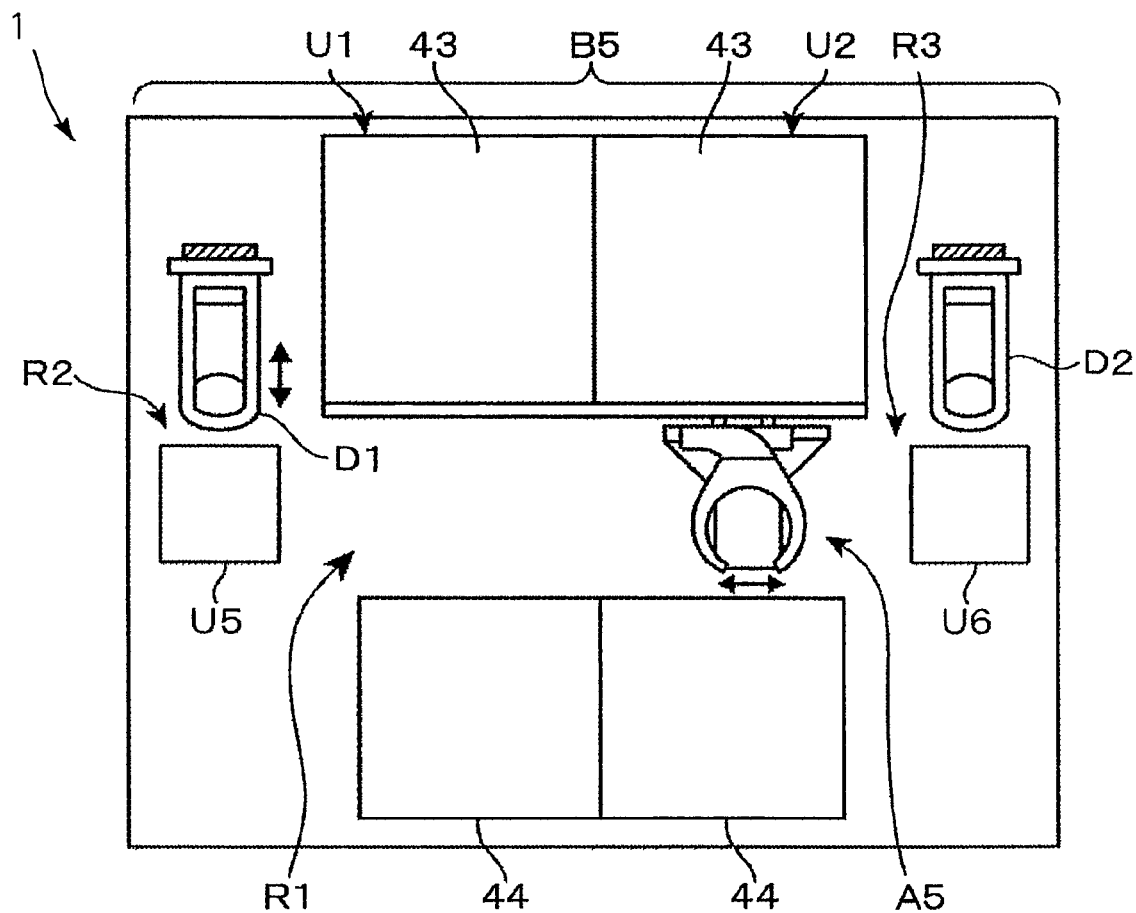
FIG. 12, which corresponds to FIG. 8, is a cross-sectional view of a substrate inspection part of the coating and developing apparatus shown in FIG. 10.

Next, a third embodiment will be described with reference to FIGS. 10 to 12. In FIGS. 10 to 12, the same parts as those of the first and second embodiments are shown by the same reference numbers, and the overlapping detailed description is omitted.

A coating and developing apparatus 1 in this embodiment has substantially the same structure as that of the coating and developing apparatus in the second embodiment. However, the coating and developing apparatus 1 in this embodiment does not have the direct transfer part M1, the transfer unit TRS1B of the tier-like unit group U5, and the transfer unit TRS6B of the tier-like unit group U6. FIG. 12 is a cross-sectional view of a substrate inspection part B5 of the coating and developing apparatus 1 in this embodiment. As shown in FIG. 12, similar to DEV layers B1 and B2, an area of the substrate inspection part B5 on a side of an interface block B3 provides a wafer transfer area R3. A tier-like unit group U6 having a transfer unit TRS7 is arranged in the area R3 at a height position facing the substrate inspection part B5 of the tier-like unit group U6. A transfer arm D2 having, e.g., the same structure as that of a transfer arm D1 is disposed in the wafer transfer area R3. The transfer arm D2 can vertically move through respective parts B1 to B5, and can access the transfer unit TRS7 and a transfer unit TRS6. In this embodiment, the transfer arm D1 corresponds to a first transfer mechanism for the first transfer unit, and the transfer arm D2 corresponds to a second transfer mechanism for the second transfer unit.

In the coating and developing apparatus 1, the wafer W is loaded into a carrier block S1, and transferred through the same path as that of the above-described embodiments. After a lower antireflection film and a resist film are formed on a surface of the wafer W, the wafer W is subjected to a predetermined inspection in a substrate inspection unit 44 of the substrate inspection part B5. Then, the wafer W is transferred to a main arm A5, the transfer unit TRS7, the transfer arm D2, the transfer unit TRS6, an interface arm I, and an exposure apparatus S4, in this order, and is exposed in the exposure apparatus S4. The exposed wafer W is returned through the same path as that of the second embodiment to the substrate inspection part B5 through the DEV layers B1 and B2, and is subjected to the above-described inspections in the substrate inspection unit 43. Thereafter, the wafer is returned to a carrier 20 through the same path as that of the second embodiment.

Figure 13:
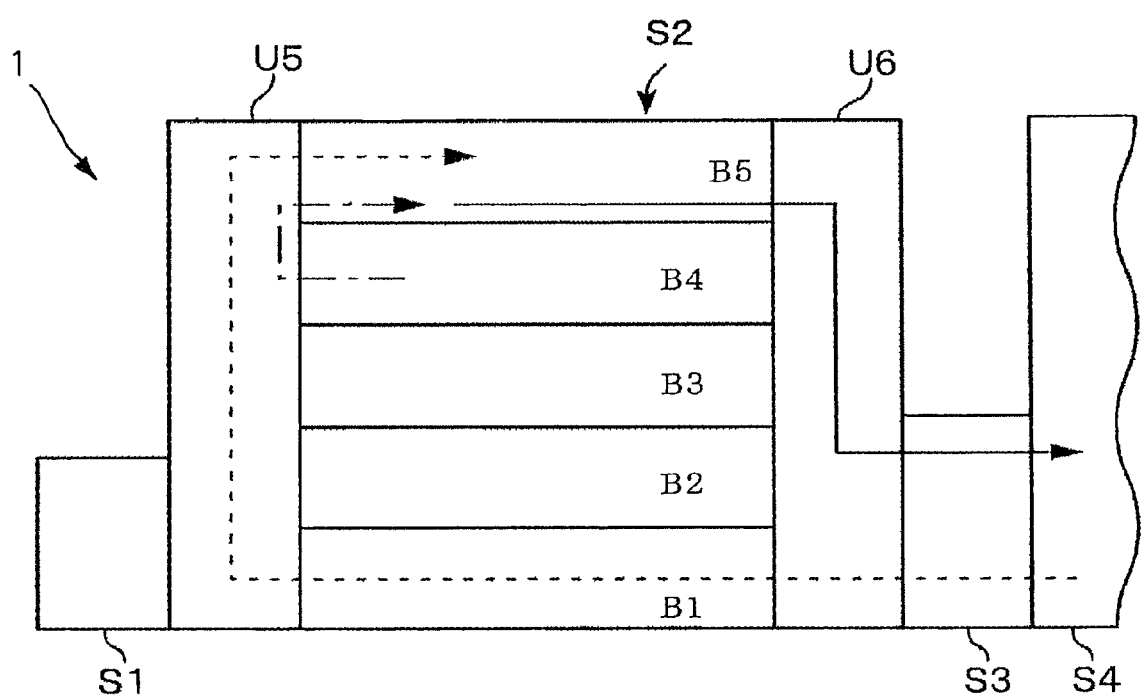
FIG. 13, which corresponds to FIG. 5, is a schematic view showing an example of a transfer path of a substrate, when a substrate is processed by the coating and developing apparatus shown in FIG. 10.
Figure 14:
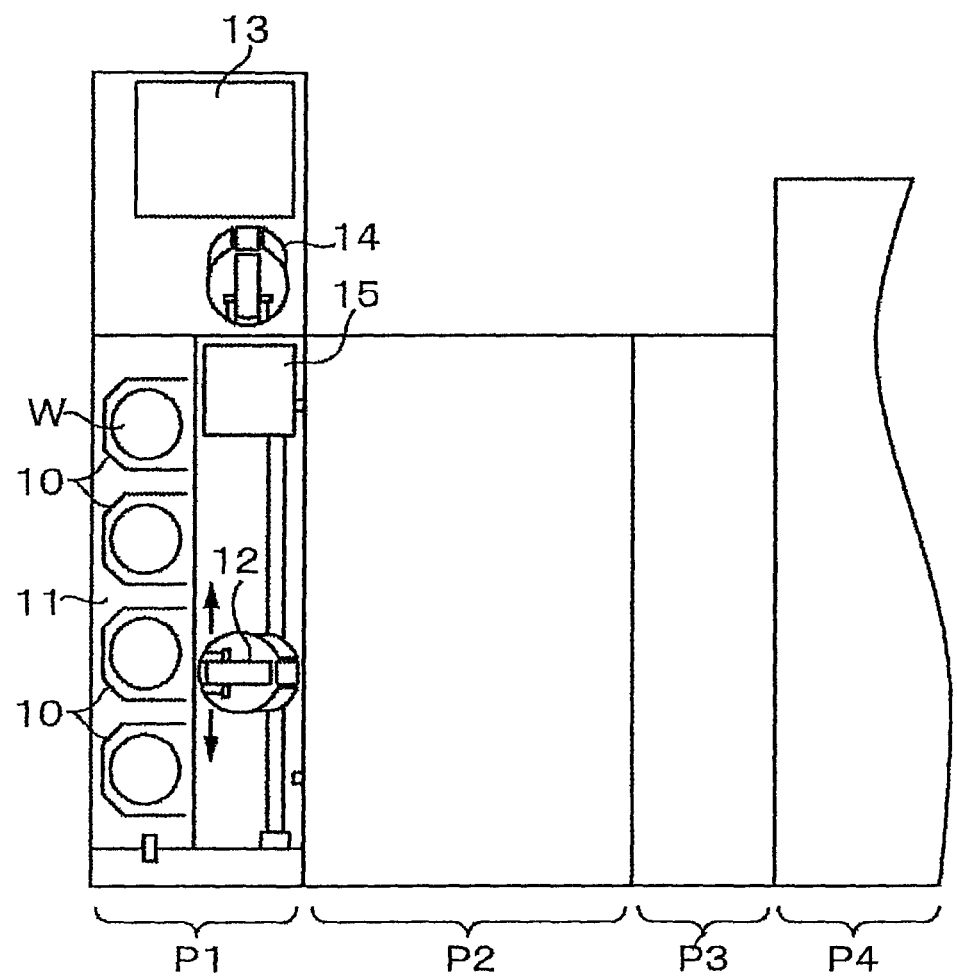
FIG. 14 is a view for explaining a conventional coating and developing apparatus.

FIG. 13 is a view schematically showing a path through which the wafer W is transferred from a film forming part to an inspection part for a post-development inspection. The wafer W is moved between the coating film forming parts B3 and B4 where a coating film is formed on the wafer W. Thereafter, as indicated by the chain line arrow, the wafer W is transferred to the substrate inspection part B5. In the substrate inspection unit 44 in the substrate inspection part B5, and is subjected to a predetermined inspection before exposure in the substrate inspection unit 44 in the substrate inspection part B5 (step 1). Then, as indicated by the solid line arrow, the wafer W is transferred from the substrate inspection part B5 to the side of an interface block S3, and is transferred through a tier-like unit group U6 to the interface block S3, and then to an exposure apparatus S4 (step 2).

As indicated by the dotted line arrow, the exposed wafer is transferred from the exposure apparatus S4 through the interface block S3 to the DEV layers B1 and B2 where the wafer W is subjected to a developing process. Then, the wafer W is transferred in the DEV layers B1 and B2 to the side of the carrier block S1. Thereafter, the wafer W is transferred again to the substrate inspection part B5 through the tier-like unit group U5, and is subjected to the above-described inspection in the substrate inspection unit 43 of the substrate inspection part B5 (step 3). After that, the wafer is returned to the carrier block S1.

Similar to the first and second embodiment, the disadvantageous layout of the apparatus, that is to say, the outward protrusion of the respective substrate inspection units from the body of the coating and developing apparatus can be avoided. Further, an installation space required for the coating and developing apparatus 1 can be narrowed.

In the second and third embodiments, the vertical arrangement order of the respective parts B is not limited in the above-described examples. For example, the inspection block including the substrate inspection units 43 and 44 is disposed as an uppermost layer. However, not limited thereto, the inspection block may be disposed as a lowermost layer, or may be interposed between the developing parts and the coating film forming part.

What is claimed is:

1. A coating and developing apparatus comprising:
   a process block including coating film forming parts each for forming a coating film on a substrate, and a developing part for developing a substrate;
   a carrier block including a transfer mechanism for the carrier block that delivers to the process block a substrate on which a coating film is to be formed, and receives the developed substrate from the process block; and
   an interface block that receives from the process block the substrate on which the coating film has been formed and delivers the substrate to an exposure apparatus, and receives an exposed substrate from the exposure apparatus and delivers the substrate to the process block;
   wherein the coating film forming parts and the developing part are vertically arranged in the process block,
   each of the coating film forming parts includes: one or more liquid process unit(s) for applying a coating liquid to a substrate; a heating process unit for heating a substrate to which the coating liquid has been applied; and a transfer mechanism for the coating film forming part for transferring a substrate between these process units of the liquid process unit(s) and the heating process unit, at least one of the coating film forming parts including a liquid process unit for applying a resist liquid to a substrate,
   the developing part includes a heating process unit for heating an exposed substrate, a liquid process unit for applying a developing liquid to a substrate, and a transfer mechanism for the developing part for transferring a substrate between these process units of the liquid process unit and the heating process unit,
   the process block further includes: a plurality of transfer units arranged at height positions respectively corresponding to the coating film forming parts and the developing part, a substrate being transferred between each transfer unit and the corresponding part via the transfer mechanism for the corresponding part; and a vertically movable transfer mechanism for the transfer unit for transferring a substrate between these transfer units, and
   at least one of the coating film forming parts and the developing part further includes a substrate inspection unit for inspecting a substrate that has been transferred thereto by the transfer mechanism for the corresponding part.

2. The coating and developing apparatus according to claim 1, wherein the coating film forming part including the liquid process unit for applying a resist liquid to a substrate includes the substrate inspection unit for inspecting a substrate on which a resist film has been formed, and
   the developing part includes the substrate inspection unit for inspecting a developed substrate.

3. The coating and developing apparatus according to claim 1, wherein at least one of the transfer mechanisms for the coating film forming part and the transfer mechanism for the developing part moves along a path extending in the corresponding part between a side of the carrier block and a side of the interface block, the process units are disposed on opposite sides of the path along which the transfer mechanism moves, and the substrate inspection unit is disposed at least on one of the sides of the path.

4. The coating and developing apparatus according to claim 1, wherein the process block further includes a direct transfer part vertically stacked on the coating film forming parts and the developing part, and
   the direct transfer part includes a transfer mechanism for the direct transfer part for directly transferring a substrate on which a coating film has been formed in the process block from a side of the carrier block to a side of the interface block.

5. The coating and developing apparatus according to claim 1, wherein the transfer units are disposed on sides of the coating film forming parts and the developing part such that the carrier block is closer to the transfer units than to the coating film forming parts and the developing part, and
   the transfer mechanism for the carrier block transfers a substrate between the same and at least one of the transfer units.

6. The coating and developing apparatus according to claim 1, wherein the process block includes at least one second transfer unit different from said transfer units, the second transfer unit being arranged at a height position corresponding to one of the coating film forming parts and the developing part.

7. The coating and developing apparatus according to claim 6, wherein a transfer of a substrate between the process block and the carrier block is performed via the transfer units, and
   a transfer of a substrate between the process block and the interface block is performed via the second transfer unit.

8. A substrate processing method for processing a substrate with the use of a coating and developing apparatus including
   a process block including
      a coating film forming part that forms a coating film on a substrate, and
      a developing part for developing a substrate;
   a carrier block from which a substrate is transferred to the process block and to which a substrate is transferred from the process block; and
   an interface block to which a substrate is transferred from the process block and from which a substrate is transferred to the process block, the interface block being connected to an exposure apparatus,
   wherein the process block further includes a direct transfer part having a transfer mechanism for the direct transfer part that directly transfers a substrate in the process block between a side of the carrier block and a side of the interface block,
   wherein the coating film forming part, the developing part, and the direct transfer part are vertically arranged in the process block, wherein each of the coating film forming part and the developing part includes
a process unit for processing a substrate,
a substrate inspection unit for inspecting a substrate, and
a transfer mechanism for the corresponding part for transferring a substrate between these units, and
wherein the process block further includes a plurality of transfer units respectively corresponding to the coating film forming part, the developing part, and the direct transfer part, a substrate being transferred between each transfer unit and the transfer mechanisms for the corresponding parts; and a transfer mechanism for the transfer unit that transfers a substrate between these transfer units,
the substrate processing method comprising the steps of:
transferring a substrate loaded into the carrier block to the coating film forming part of the process block;
forming a resist film on the substrate in the process unit of the coating film forming part;
transferring the substrate on which the resist film has been formed by the transfer mechanism for the coating film forming part to the substrate inspection unit of the coating film forming part, and inspecting the substrate;
transferring the inspected substrate from the coating film forming part to the direct transfer part via the transfer unit, and further transferring the substrate to the interface block by means of the transfer mechanism for the direct transfer part;
transferring the coated substrate to the exposure apparatus;
exposing the coated substrate;
transferring the exposed substrate to the interface block;
transferring the exposed substrate to the developing part of the process block;
developing the exposed substrate in the process unit of the developing part;
transferring the developed substrate by the transfer mechanism for the developing part to the substrate inspection unit of the developing part, and inspecting the substrate; and
transferring the inspected substrate to the carrier block.

9. A storage medium storing a program executed by a control device for controlling a coating and developing apparatus including
a process block including
a coating film forming part that forms a coating film on a substrate, and
a developing part for developing a substrate;
a carrier block from which a substrate is transferred to the process block and to which a substrate is transferred from the process block; and
an interface block to which a substrate is transferred from the process block and from which a substrate is transferred to the process block, the interface block being connected to an exposure apparatus,
wherein the process block further includes a direct transfer part having a transfer mechanism for the direct transfer part that directly transfers a substrate in the process block between a side of the carrier block and a side of the interface block,
wherein the coating film forming part, the developing part, and the direct transfer part are vertically arranged in the process block,
wherein each of the coating film forming part and the developing part includes
a process unit for processing a substrate,
a substrate inspection unit for inspecting a substrate, and
a transfer mechanism for the corresponding part for transferring a substrate between these units, and
wherein the process block further includes a plurality of transfer units respectively corresponding to the coating film forming part, the developing part, and the direct transfer part, a substrate being transferred between each transfer unit and the corresponding part; and a transfer mechanism for the transfer unit that transfers a substrate between these transfer units,
the storage medium executed by the control device to execute a substrate processing method comprising the steps of:
transferring a substrate loaded into the carrier block to the coating film forming part of the process block;
forming a resist film on the substrate in the process unit of the coating film forming part;
transferring the substrate on which the resist film has been formed by the transfer mechanism for the coating film forming part to the substrate inspection unit of the coating film forming part, and inspecting the substrate;
transferring the inspected substrate from the coating film forming part to the direct transfer part via the transfer unit, and further transferring the substrate to the interface block by means of the transfer mechanism for the direct transfer part;
transferring the coated substrate to the exposure apparatus;
exposing the coated substrate;
transferring the exposed substrate to the interface block;
transferring the exposed substrate to the developing part of the process block;
developing the exposed substrate in the process unit of the developing part;
transferring the developed substrate by the transfer mechanism for the developing part to the substrate inspection unit of the developing part, and inspecting the substrate; and
transferring the inspected substrate to the carrier block.

* * * * *